US012563796B2

(12) United States Patent
Xie et al.

(10) Patent No.: US 12,563,796 B2
(45) Date of Patent: Feb. 24, 2026

(54) EXTENDED LOWER SOURCE/DRAIN FOR STACKED FIELD-EFFECT TRANSISTOR

(71) Applicant: International Business Machines Corporation, Armonk, NY (US)

(72) Inventors: Ruilong Xie, Niskayuna, NY (US); Chen Zhang, Guilderland, NY (US); Jingyun Zhang, Albany, NY (US); Pietro Montanini, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 916 days.

(21) Appl. No.: 17/557,676

(22) Filed: Dec. 21, 2021

(65) Prior Publication Data

US 2023/0197778 A1 Jun. 22, 2023

(51) Int. Cl.
| | |
|---|---|
| *H10D 62/10* | (2025.01) |
| *H10D 30/67* | (2025.01) |
| *H10D 84/01* | (2025.01) |
| *H10D 84/03* | (2025.01) |

(52) U.S. Cl.
CPC ....... *H10D 62/118* (2025.01); *H10D 30/6713* (2025.01); *H10D 30/6757* (2025.01); *H10D 62/115* (2025.01); *H10D 84/0128* (2025.01); *H10D 84/013* (2025.01); *H10D 84/038* (2025.01)

(58) Field of Classification Search
CPC ............. H10D 84/0128; H10D 84/013; H10D 84/038; H10D 62/115; H10D 62/118; H10D 30/6757; H10D 30/6713
See application file for complete search history.

(56) References Cited

U.S. PATENT DOCUMENTS

| | | | |
|---|---|---|---|
| 9,659,963 B2 | 5/2017 | Cheng | |
| 9,812,575 B1* | 11/2017 | Reznicek | H10D 86/215 |
| 9,837,414 B1* | 12/2017 | Balakrishnan | H10D 84/0172 |
| 10,373,977 B2 | 8/2019 | Glass | |
| 11,031,489 B2 | 6/2021 | Lin | |
| 2020/0006559 A1* | 1/2020 | Mehandru | H10D 84/83 |
| 2020/0266190 A1 | 8/2020 | Radosavljevic | |
| 2020/0273756 A1* | 8/2020 | Cheng | H10D 84/016 |
| 2020/0279916 A1 | 9/2020 | Rachmady | |
| 2020/0365585 A1 | 11/2020 | Jambunathan | |
| 2021/0083072 A1 | 3/2021 | Feng | |
| 2021/0210349 A1* | 7/2021 | Xie | H10D 84/0193 |

FOREIGN PATENT DOCUMENTS

WO 2018063280 A1 4/2018

OTHER PUBLICATIONS

Slovick, From FinFETs to Nanosheets: ICs Evolve to Keep Pace with 'Moore's Law', 2021 (Year: 2021).*

* cited by examiner

*Primary Examiner* — Britt Hanley
*Assistant Examiner* — Casey Paul Boatman
(74) *Attorney, Agent, or Firm* — Gavin Giraud

(57) ABSTRACT

Embodiments herein include semiconductor structures with an active channel stack having an upper field-effect transistor (FET) and a lower FET vertically stacked below the upper FET The semiconductor structure may also include a dummy stub adjacent to the active channel stack, a lower source/drain (S/D) connected to the active channel stack and laterally extended over the dummy stub, and an upper S/D connected to the active channel stack above the lower S/D.

20 Claims, 29 Drawing Sheets

EXTENDED LOWER SOURCE/DRAIN FOR STACKED FIELD-EFFECT TRANSISTOR

BACKGROUND

The present invention relates generally to the field of fabrication of semiconductor devices, and more particularly to forming a lower source/drain (S/D) across an active channel stack and a dummy stack.

In fabricating semiconductor devices, millions of devices can be located together on a single substrate. The continued miniaturization of metal oxide semiconductor field effect transistors (MOSFETs) has enabled useful control of these millions of devices. However, there are growing signs today that metal oxide semiconductor transistors are beginning to reach their traditional scaling limits. Since it has become increasingly difficult to improve performance of MOSFETs, and therefore complementary metal oxide semiconductor (CMOS), through continued scaling, further methods for improving performance in addition to scaling have become critical.

Three dimensional (3D) monolithic integration is touted as an alternative for continued CMOS density scaling. CMOS devices that utilize 3D monolithic integration achieve a significant area reduction by utilizing stacked transistors. These CMOS devices also achieve shorter interconnect routing utilizing shorter vertical wiring rather than longer horizontal wiring.

SUMMARY

According to one embodiment of the present invention, a semiconductor structure is disclosed. The semiconductor structure may include an active channel stack with an upper field-effect transistor (FET) and a lower FET vertically stacked below the upper FET The semiconductor structure may also include a dummy stub adjacent to the active channel stack, a lower source/drain (S/D) connected to the active channel stack and laterally extended over the dummy stub, and an upper S/D connected to the active channel stack above the lower S/D.

According to one embodiment of the present invention, a method is disclosed. The method may include forming an active channel stack and a dummy stack adjacent to the active channel stack, growing a lower source/drain (S/D) across the active channel stack and the dummy stack, growing a first top S/D on the active channel stack and a second top S/D on the dummy stack, and removing the dummy stack except for a dummy stub.

According to one embodiment of the present invention, a semiconductor structure is disclosed. The semiconductor structure may include an upper source/drain (S/D) electrically connected to an active channel stack and a lower S/D electrically connected to the active channel stack. The lower S/D may include a first growth between the upper S/D and the active channel stack and a second growth between a dummy stub and a contact.

DETAILED DESCRIPTION

Figure 2A:
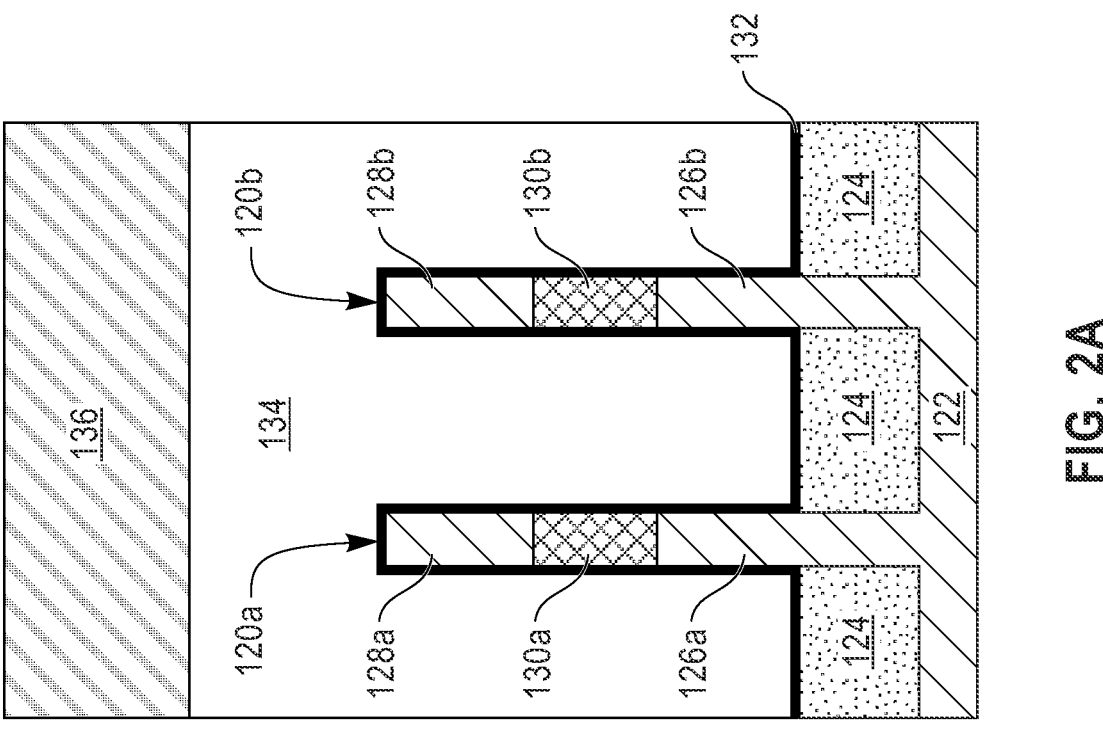
FIGS. 2A, 2B, and 2C depict schematic cross-sectional side views of the semiconductor structure of FIG. 1 at a fabrication stage, in accordance with one embodiment of the present invention.

In the following detailed description, reference is made to the accompanying drawings, which show specific examples of embodiments of the invention. These embodiments are described in sufficient detail to enable those skilled in the art to practice them, and it is to be understood that other embodiments may be utilized and that structural, logical and electrical changes may be made without departing from the described embodiments. The following detailed description is, therefore, not to be taken in a limiting sense, and the included embodiments are defined by the appended claims.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

References in the specification to "one embodiment," "an embodiment," "an example embodiment," etc., indicate that the embodiment described may include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "right," "left," "vertical," "horizontal," "top," "bottom," "lower," "upper" and derivatives thereof shall relate to the disclosed structures and methods, as oriented in the drawing Figures. The terms "overlaying," "atop," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

With regard to the fabrication of transistors and integrated circuits, major surface refers to that surface of the semiconductor layer in and about which a plurality of transistors are fabricated, e.g., in a planar process. As used herein, the term "vertical" means substantially orthogonal with respect to the major surface and "horizontal" means substantially parallel to the major surface. Typically, the major surface is along a plane of a monocrystalline silicon layer on which transistor devices are fabricated.

For integrated circuits, the masking, patterning, and etching of device components makes possible the fabrication of semiconductor devices at the micro and nano scale. Stacked field-effect transistor (FET) devices provide many advantages for continued progress in scaling the fabrication of these devices. Despite the advantages in 3D monolithic integration and stacked FET devices, forming contact structures to 3D stacked transistors remains a challenge. Specifically, the lower source/drain (S/D) in stacked FET devices is buried underneath the top S/D and is therefore difficult to reach using existing contact formation methods.

The devices and methods disclosed below address the problems associated with forming contacts to stacked FET devices. Rather than fabricating the stacked FET devices as a staircase fin stack, embodiments disclosed herein include a lower S/D that is epitaxially grown over an active channel stack and over a dummy stack. The dummy stack is subsequently removed, leaving a dummy stub. The double-wide lower S/D is able to electrically connect to a lower S/D contact that is metalized over the dummy stub.

Figure 1:
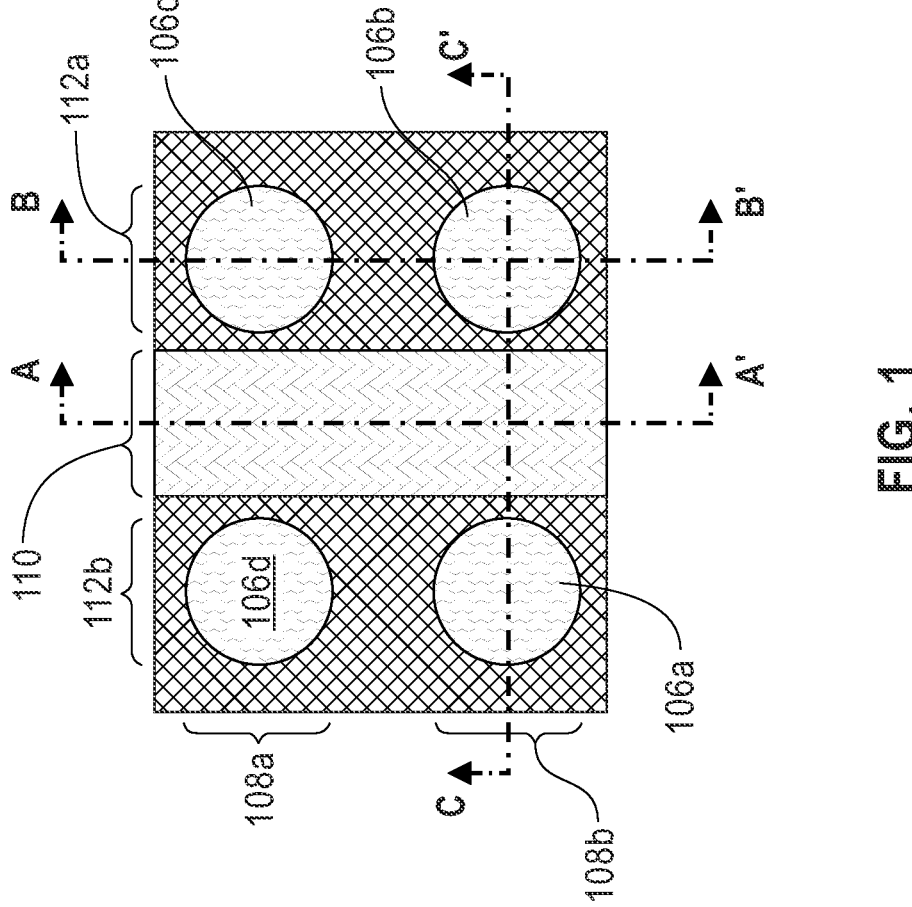
FIG. 1 depicts a schematic top view of a semiconductor structure, in accordance with one embodiment of the present invention.

Turning now to the figures, FIG. 1 depicts a schematic top view of a semiconductor structure 100, in accordance with one embodiment of the present invention. The schematic view shows a relationship of rows and columns at a fabrication stage after S/D contacts 106a, b, c, d have been metallized. The rows may include fins (not shown in FIG. 1) fabricated as part of a field-effect transistor (FET) region (e.g., n-type FET (NFET) and p-type FET (PFET)). A first fin region 108a includes an active channel stack, while an adjacent second fin region 108b includes a dummy stack. As used herein, when one feature is located within one row or column, an "adjacent" feature is in the immediately next row or column.

The columns of the semiconductor structure 100 include a gate region 110 and S/D regions 112a, b. The gate region 110 runs between a first S/D region 112a on a first side and a second S/D region 112b on a second side. The following figures are cross-sectional side views of: (i) the gate region 110 along line A-A'; (ii) the S/D region first side 112a the S/D region B-B; and (iii) the second fin region 108b along line C-C' at fabrication stages of the semiconductor structure 100.

Figures 2B, 2C:
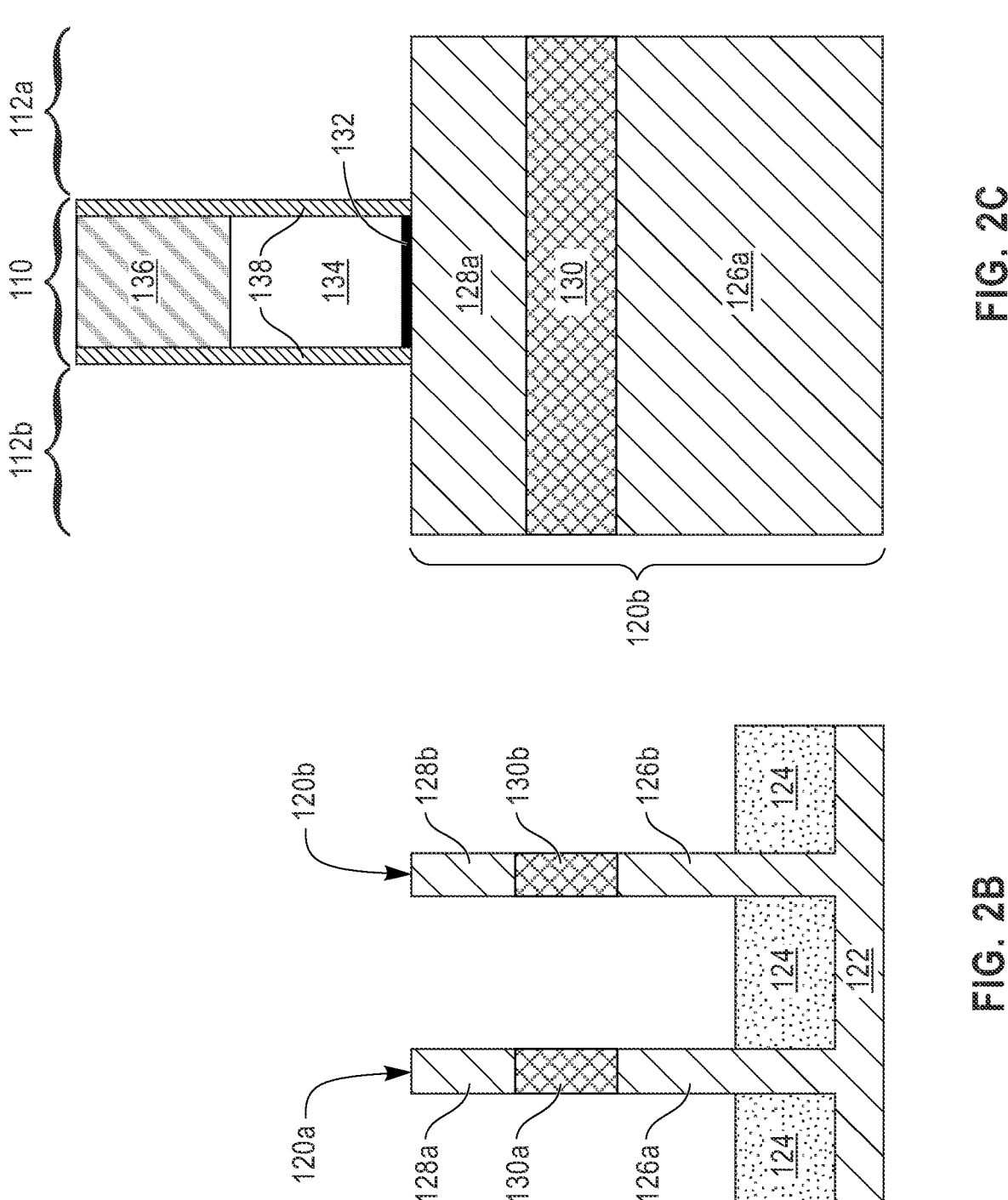

FIGS. 2A, 2B, and 2C are schematic cross-sectional side views of the semiconductor structure 100 of FIG. 1 at a fabrication stage, in accordance with one embodiment of the present invention. The semiconductor structure 100 has fins 120a, b that extend laterally through the gate region 110 and the S/D regions 112a, b. A substrate 122 and shallow trench isolation (STI) 124 also extend along the length of the semiconductor structure 100 through the gate region 110 and the S/D regions 112a, b. Each of the fins 120a, b includes a lower field-effect transistor (FET) 126a, b and an upper FET 128a, b. The first fin 120a includes FETs 126a, 128a that will remain an active channel stack in the final semiconductor structure. The first fin 120a being an active channel stack means that the lower FET 126a and the upper FET 128a will actively respond to gate signals conveying read/write commands. As explained in detail below, the second fin 120b is not an active channel stack, but will be removed before the fabrication of the semiconductor structure 100 is finished.

The lower FETs 126a, b and the upper FETs 128a, b may be patterned by conventional lithography and etch processes such as chemical vapor deposition (CVD), physical vapor deposition (PVD), or atomic layer deposition (ALD). Between the FETs 126, 128, a dielectric isolation 130 is present. The dielectric isolation 130 may be formed of SiO2 or SiN, etc. This is formed by starting from a SOI wafer, and patterning the FIN 120a, b through top Si, BOX SiO2 and etch into the Si substrate. The fins 120a, b are then covered by a dummy gate oxide 132 and a dummy gate 134, which may also be deposited as blanket layers. The dummy gate oxide 132 and the dummy gate 134 may then be etched from the S/D regions 112a, b using a hard mask 136 which is patterned by conventional lithography and etch process, such that the dummy gate 134 only remains in the gate region 110. The hard mask 136 includes a material such as SiN, SiO2 or combination of both layers. After that, a gate spacer 138 is formed at sidewall of gate and gate hardmask.

Figure 3A:
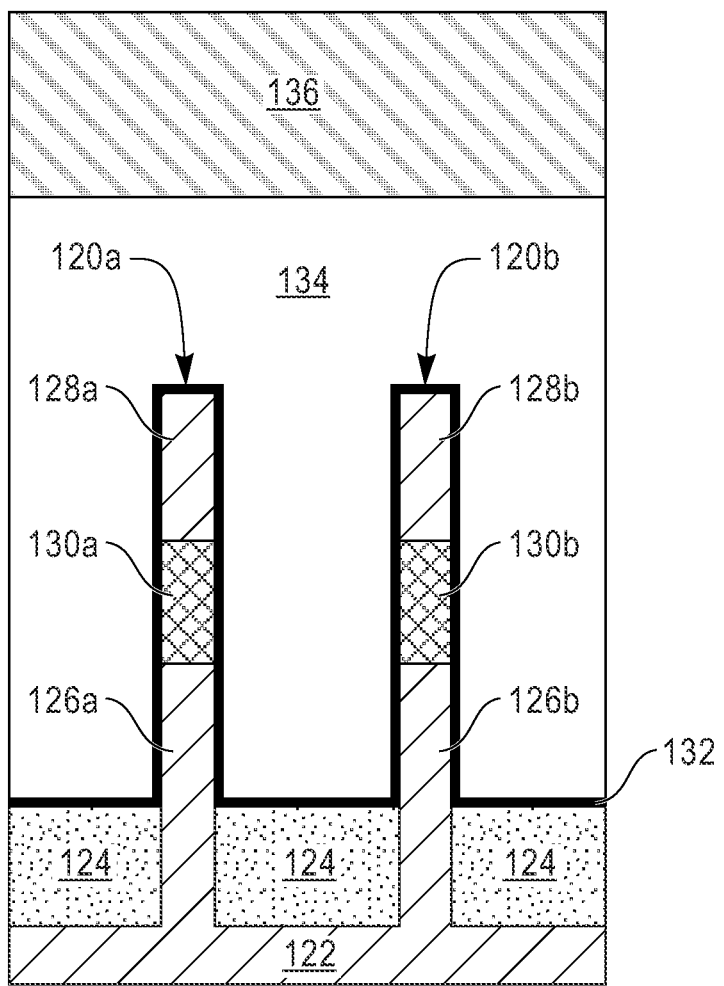
FIGS. 3A, 3B, and 3C depict schematic cross-sectional side views of the semiconductor structure of FIG. 1 at a subsequent fabrication stage, in accordance with one embodiment of the present invention.
Figure 3C:
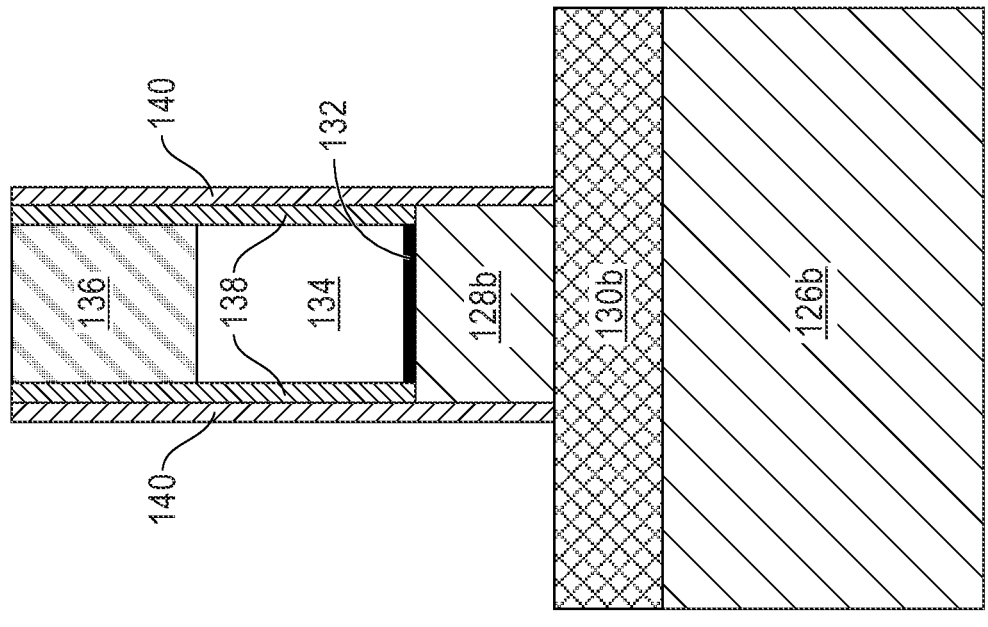
Figure 3B:
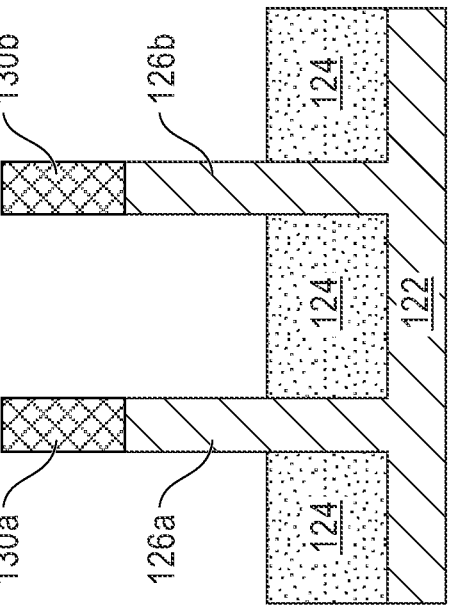

FIGS. 3A, 3B, and 3C are schematic cross-sectional side views of the semiconductor structure of FIG. 1 at a subsequent fabrication stage, in accordance with one embodiment of the present invention. The semiconductor structure 100, subsequent to the formation of the dummy gate 134 and the gate spacers 138, may have the upper FETs 128a, b recessed in the S/D regions 112a, b. The hard mask 136 remaining in the gate region 110 (i.e., detailed in FIG. 3A) is unaffected by the directional and/or selective etch process used in the recession process, and the portion of the upper FET 128a, b that is below the hard mask 136 remains intact on each fin 120a, b. An additional spacer 140 seals the edges of the upper FET 128b.

Figure 4A:
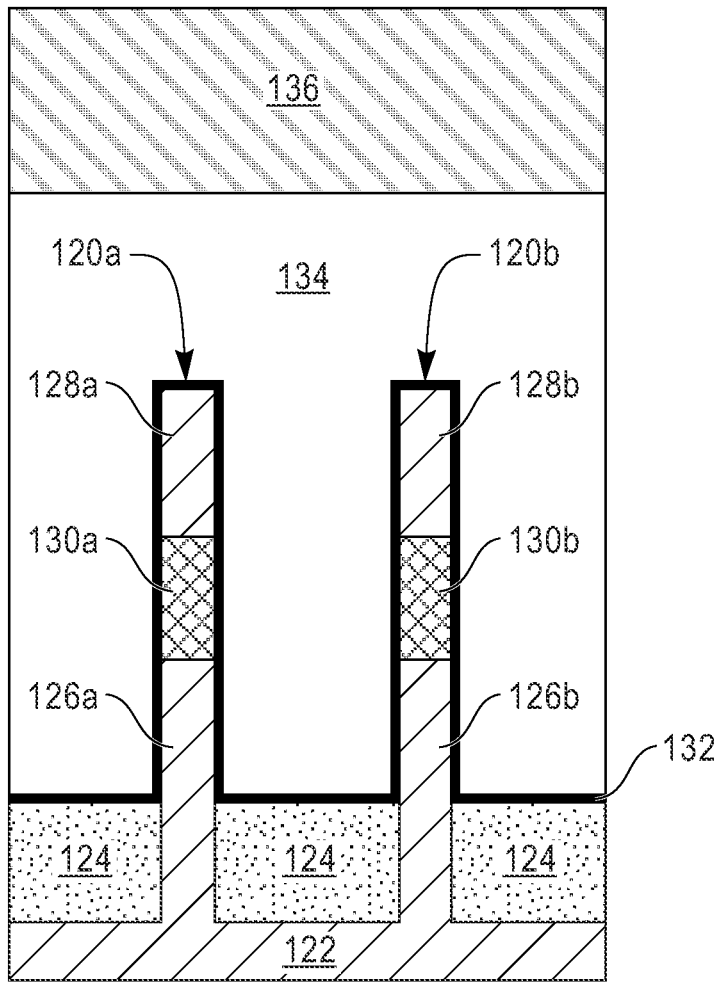
FIGS. 4A, 4B, and 4C depict schematic cross-sectional side views of the semiconductor structure of FIG. 1 at a subsequent fabrication stage, in accordance with one embodiment of the present invention.
Figure 4C:
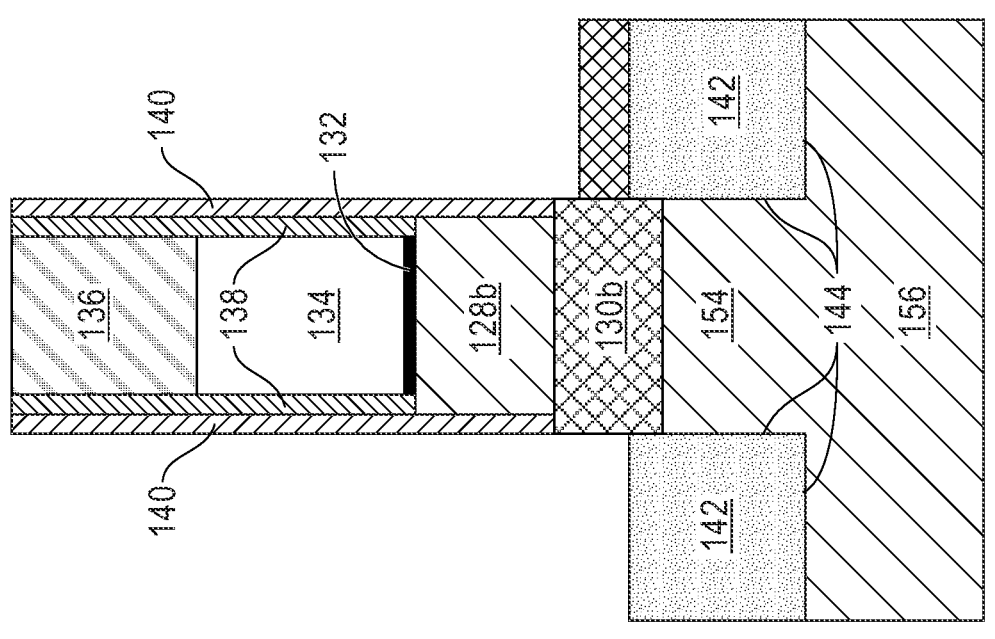
Figure 4B:
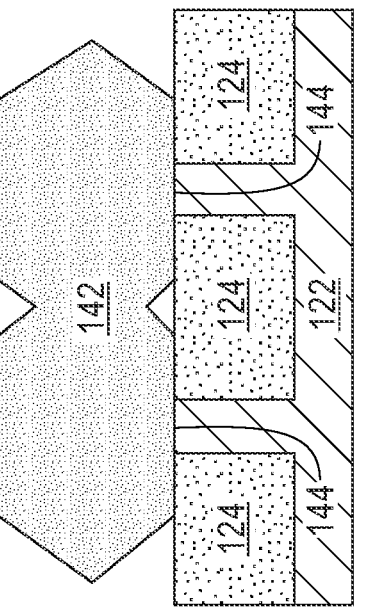

FIGS. 4A, 4B, and 4C are schematic cross-sectional side views of the semiconductor structure 100 of FIG. 1 at a subsequent fabrication stage, in accordance with one embodiment of the present invention. The semiconductor structure 100 has the dielectric isolation 130 and the lower FETs 126 etched in the S/D regions 112a, b, in a similar manner to the upper FETs 128a, b shown in FIGS. 3A, 3B, and 3C. The lower FETs 126a, b do not include the additional spacer 140, however, since the step after etching the lower FETs 126a, b includes growing a lower S/D 142 on exposed edges 144 of the lower FETs 126a, b. The lower S/D 142 has two growths. A first growth grows on the exposed edges 144 of the first fin 120a and a second growth grows on the second fin 120b. The first growth and second growth merge together to form a laterally extended S/D. The lower S/D 142 may be grown epitaxially, and does not grow from the surfaces of the dielectric isolation 130, the additional spacer 140, or the STI 124. Therefore, the epitaxial growth of the lower S/D 142 can be controlled, but since the growth from the first fin 120a and the second fin 120b can grow together, a "double wide" S/D is formed that enables a wider surface for connecting a source/drain contact.

Figure 5A:
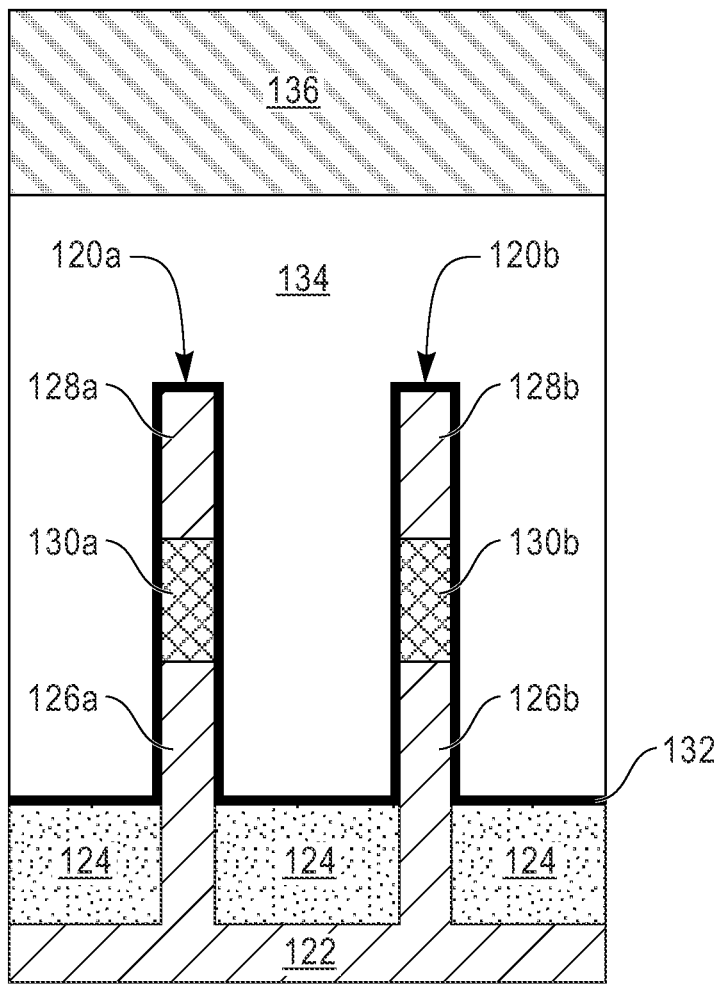
FIGS. 5A, 5B, and 5C depict schematic cross-sectional side views of the semiconductor structure of FIG. 1 at a subsequent fabrication stage, in accordance with one embodiment of the present invention.
Figure 5C:
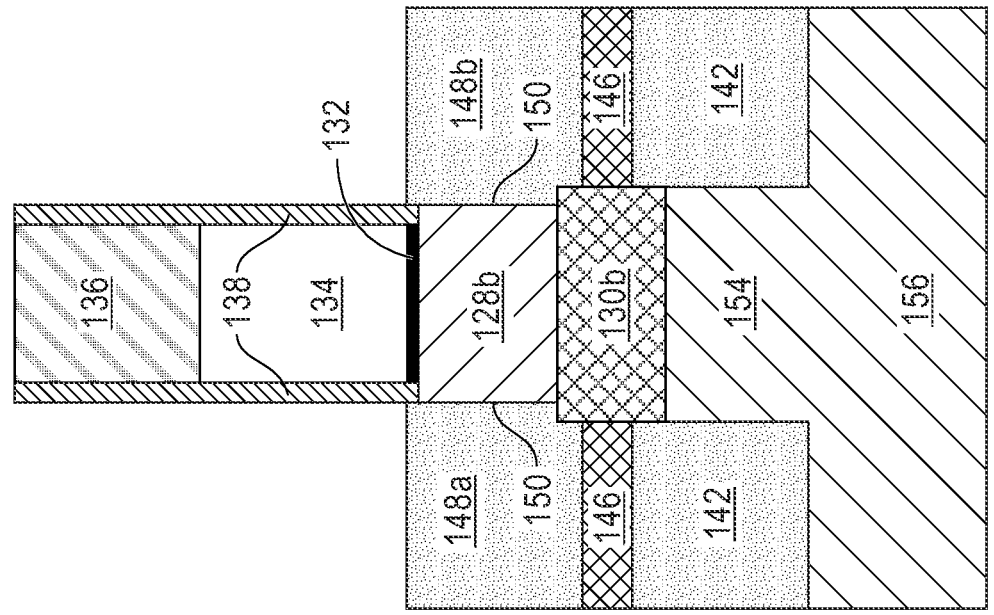
Figure 5B:
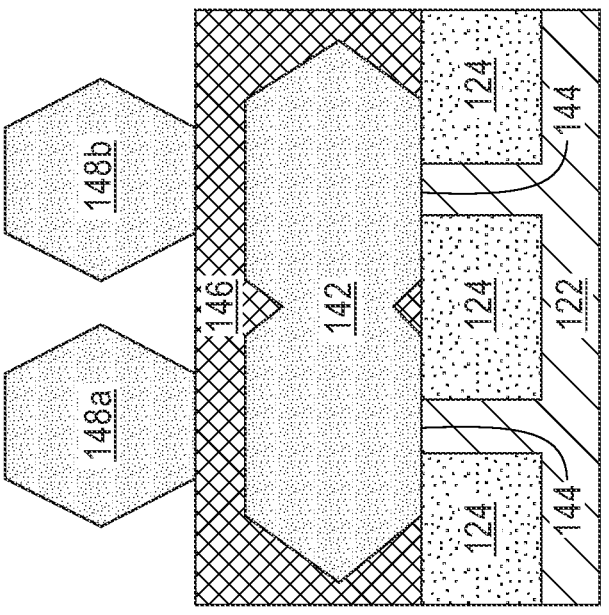

FIGS. 5A, 5B, and 5C are schematic cross-sectional side views of the semiconductor structure 100 of FIG. 1 at a subsequent fabrication stage, in accordance with one embodiment of the present invention. The semiconductor structure 100 has an interlayer dielectric (ILD) 146 deposited over the lower S/D 142 so that none of the lower S/D 142 is exposed. The ILD 146 may include SiN, SiOx, SiCN, SiCN(H), a low-k dielectric material, or an ultra-low-k dielectric material, and may cover a portion of the dielectric isolation 130, but does not cover the additional spacer 140 that protects the upper FET 128. After the ILD 146 is deposited and recessed, the additional spacer 140 is removed, and upper S/Ds 148a, b are grown on exposed edges 150 of the upper FETs 128a, b. The epitaxial growth of the upper S/Ds 148a, b is controlled to keep the first upper S/D 148a separated from the second upper S/D 148b. For example, the epitaxial growth for each upper S/D 148a, b initiates at one edge 150 rather than the two edges 144 that initiate the epitaxial growth of the double-wide lower S/D 142.

Figure 6A:
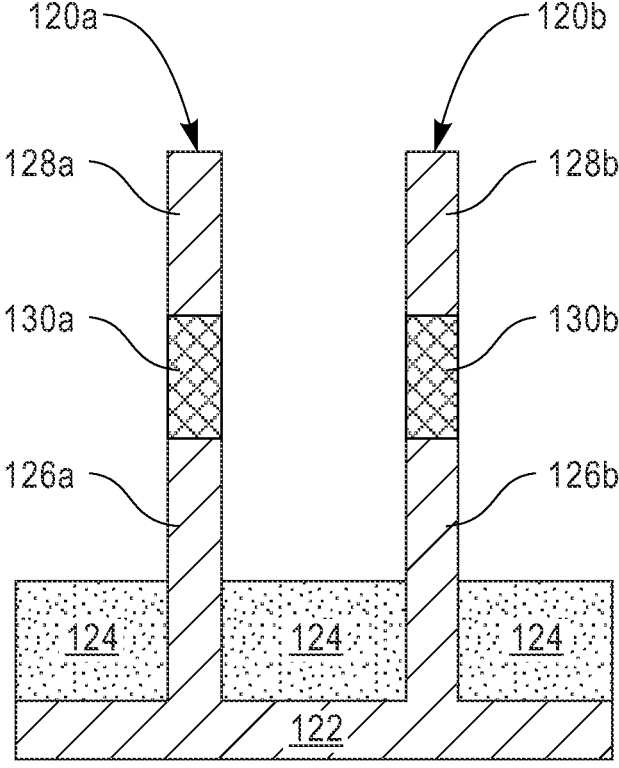
FIGS. 6A, 6B, and 6C depict schematic cross-sectional side views of the semiconductor structure of FIG. 1 at a subsequent fabrication stage, in accordance with one embodiment of the present invention.
Figure 6C:
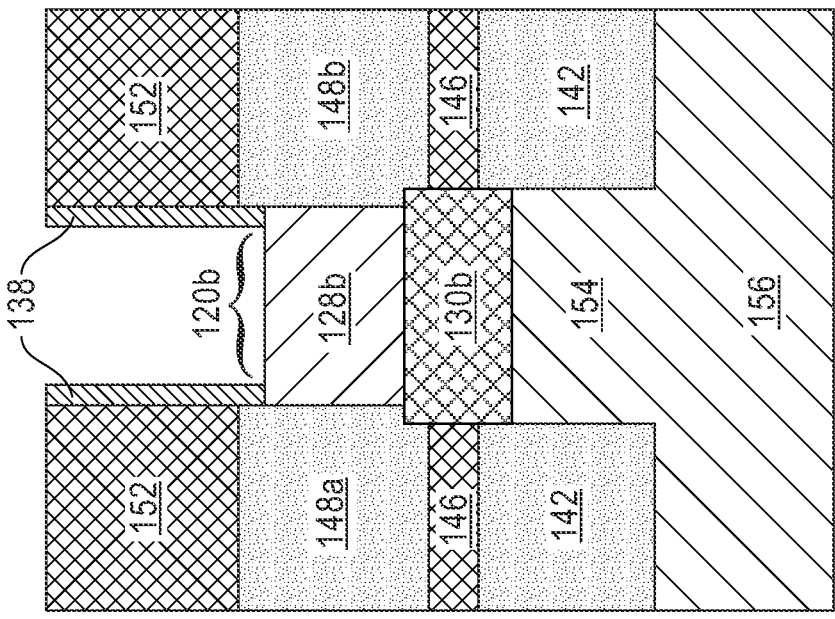
Figure 6B:
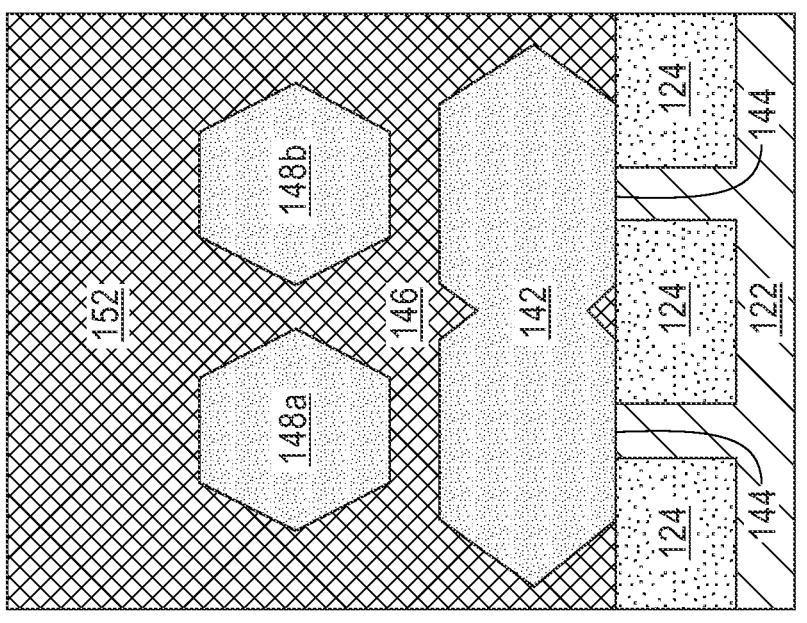

FIGS. 6A, 6B, and 6C are schematic cross-sectional side views of the semiconductor structure 100 of FIG. 1 at a subsequent fabrication stage, in accordance with one embodiment of the present invention. The semiconductor structure 100 has an additional portion of ILD 152 deposited over the upper S/D 148, and the hard mask 136, the dummy gate 134, and the dummy gate oxide 132 removed from the gate region 110. The additional ILD 152 completely covers the upper S/Ds 148a, b and electrically insulates each S/D from the other S/Ds (e.g., the lower S/D 142 from the first upper S/D 148a and the second upper S/D 148b). The additional ILD 152 may be formed of the same material as the ILD 146, or in certain embodiments may be formed of a different material (e.g., a different low-K dielectric material).

The semiconductor structure 100 may have the hard mask 136, the dummy gate 134, and the dummy gate oxide 132 removed with a selective etch process that leaves the gate spacers 138 intact with the fins 120a, b and the ILD 146, 152.

Figure 7A:
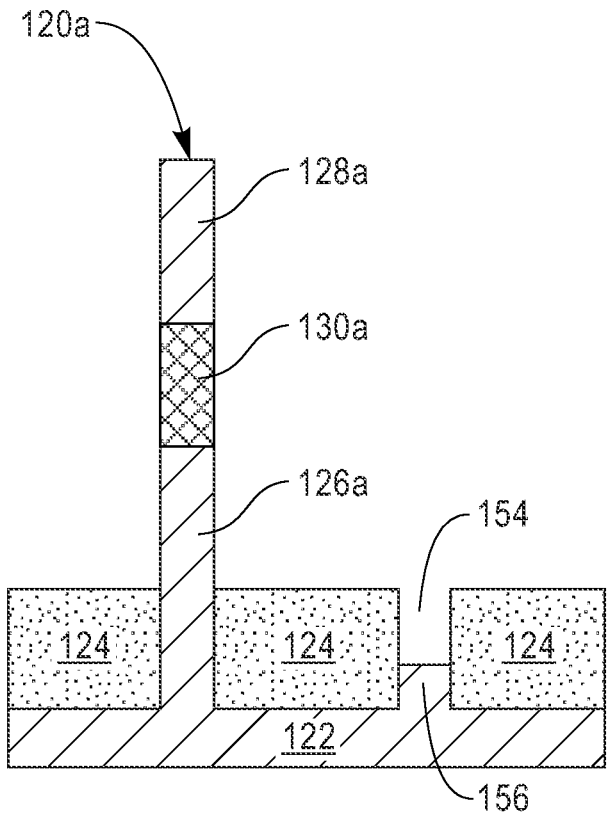
FIGS. 7A, 7B, and 7C depict schematic cross-sectional side views of the semiconductor structure of FIG. 1 at a subsequent fabrication stage, in accordance with one embodiment of the present invention.
Figure 7C:
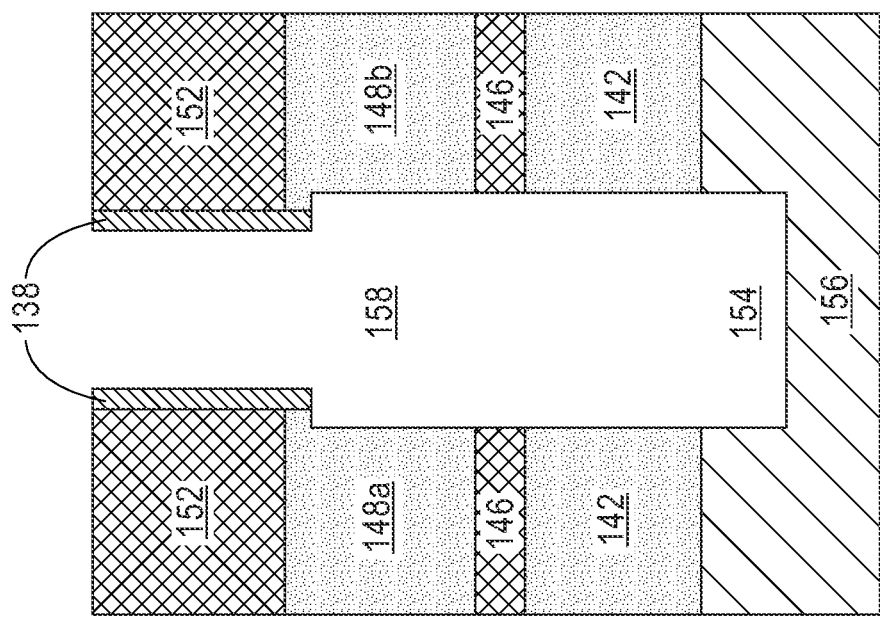
Figure 7B:
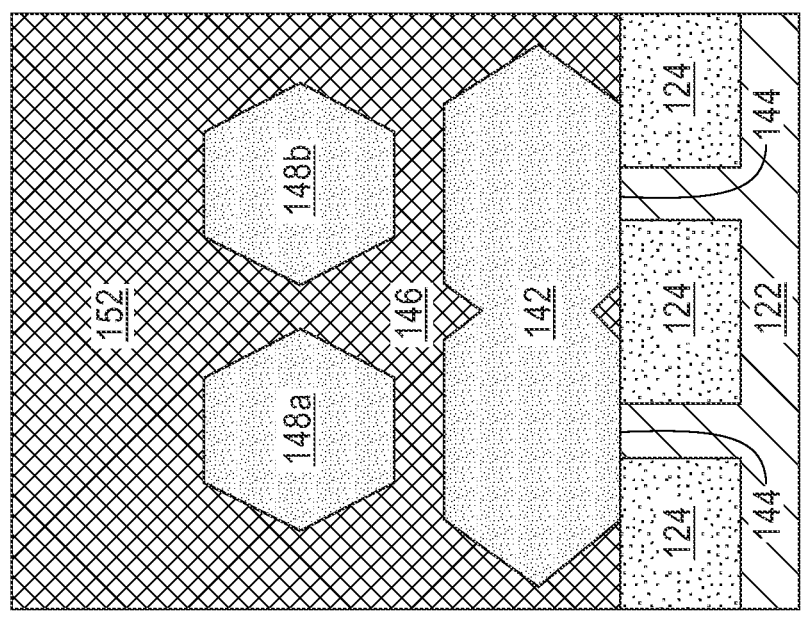

FIGS. 7A, 7B, and 7C are schematic cross-sectional side views of the semiconductor structure 100 of FIG. 1 at a subsequent fabrication stage, in accordance with one embodiment of the present invention. The semiconductor structure 100 has the second fin 120b selectively etched from between the upper S/Ds 148a, b and the lower S/Ds 142. The second fin 120b may be etched using a selective wet, dry, or directional etch. Furthermore, a masking material may be added to the first fin 120a to protect the first fin 120a from being etched with the second fin 120b. The etching of the second fin 120b leaves a gap 154 and a dummy stub 156 in the STI 124 in the gate region 110, and a fin void 158 between the upper S/Ds 148a, b and the lower S/Ds 142, and between the gate spacers 138 in the gate region 110.

Figure 8A:
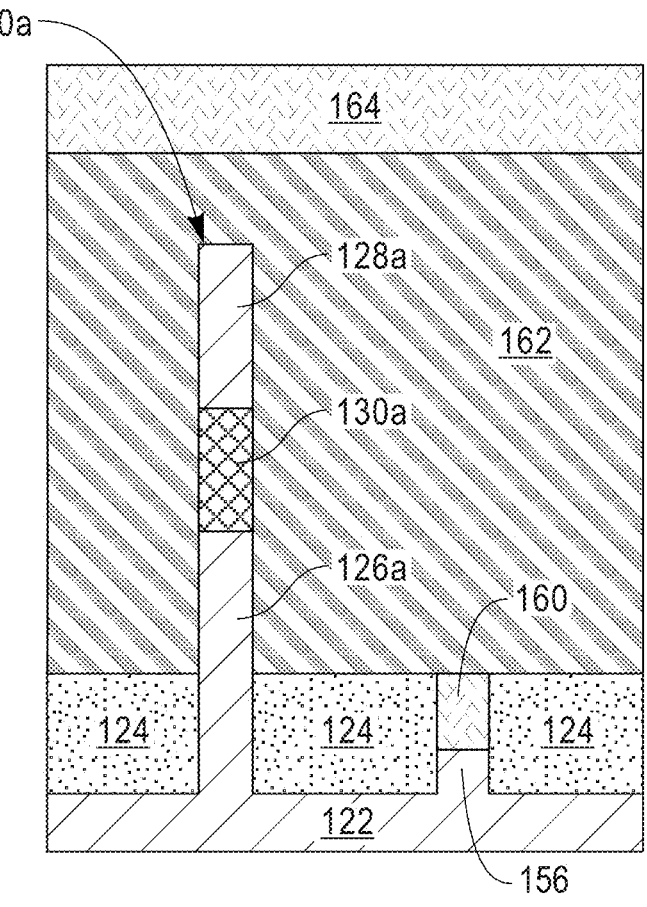
FIGS. 8A, 8B, and 8C depict schematic cross-sectional side views of the semiconductor structure of FIG. 1 at a subsequent fabrication stage, in accordance with one embodiment of the present invention.
Figure 8C:
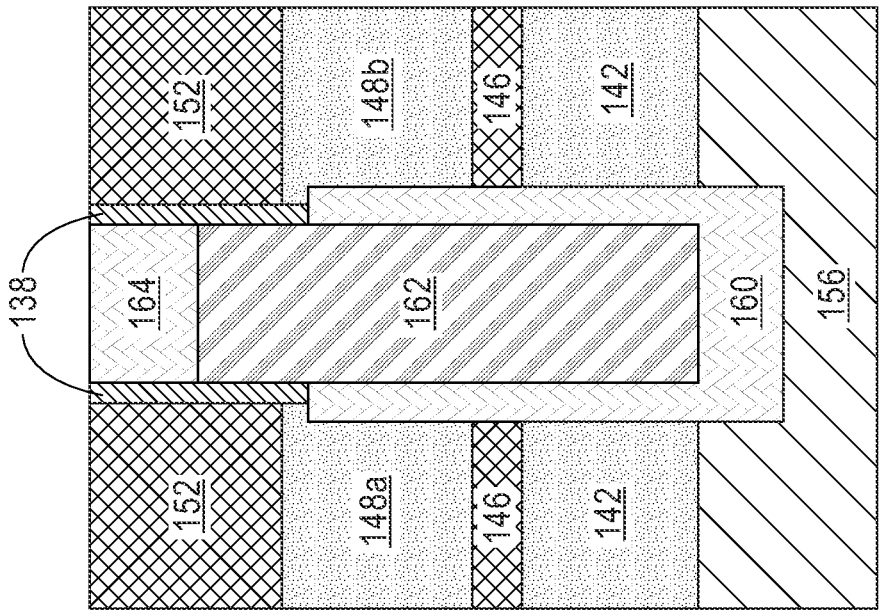
Figure 8B:
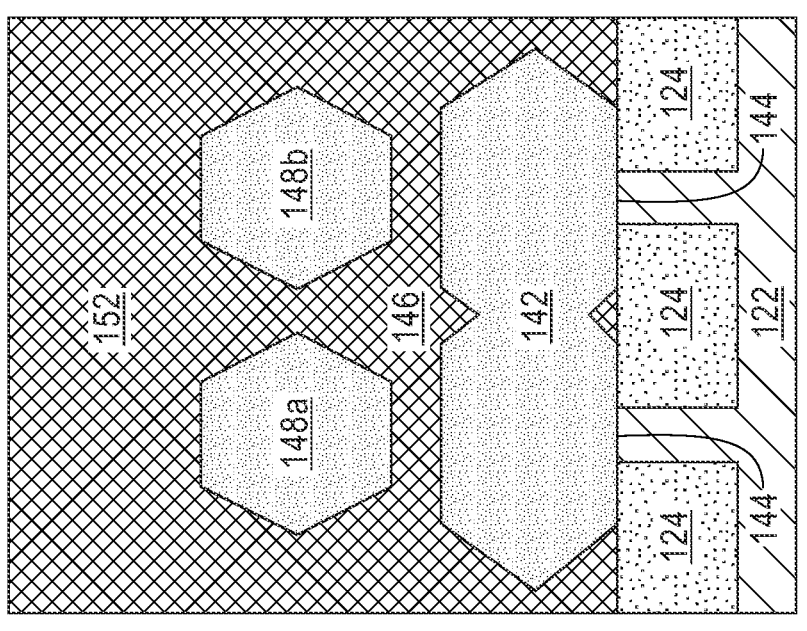

FIGS. 8A, 8B, and 8C are schematic cross-sectional side views of the semiconductor structure 100 of FIG. 1 at a subsequent fabrication stage, in accordance with one embodiment of the present invention. The semiconductor structure 100 a dielectric liner 160 and a gate stack 162 in the gate region 110. The dielectric liner 160 may be formed using a divot fill process within the fin void 158 such that a dielectric material is conformally deposited until the dielectric liner 160 pinches of in the gap 154 above the dummy stub 156. The dielectric liner 160 may then be etched back so that only a thin portion of the dielectric liner 160 remains.

The gate stack 162 may include a high-K metal gate and a work-function metal (WFM) and optionally a conductive metal over the WFM. The gate stack 162 controls the electric fields to the active channel stack including the upper FET 128a and the lower FET 126a of the active fin 120a. The dielectric liner 160 surrounds the high-κ metal gate and WFM to insulate and isolate the gate stack 162 from the S/Ds 142, 148a, b. The gate stack 162 may also be recessed and a gate dielectric cap 164 can be formed over the gate 162.

Figure 9A:
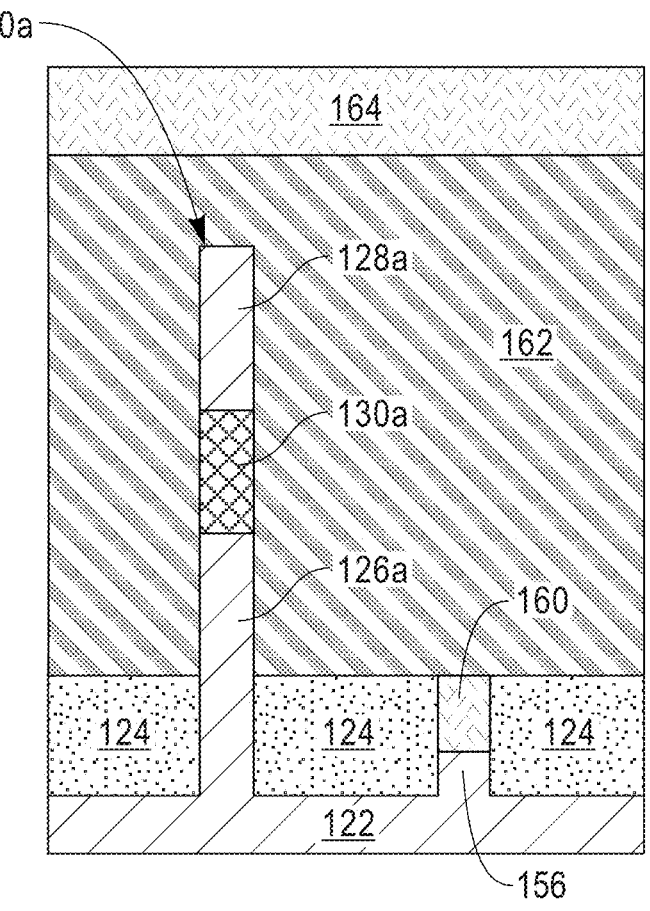
FIGS. 9A, 9B, and 9C depict schematic cross-sectional side views of the semiconductor structure of FIG. 1 at a subsequent fabrication stage, in accordance with one embodiment of the present invention.
Figure 9C:
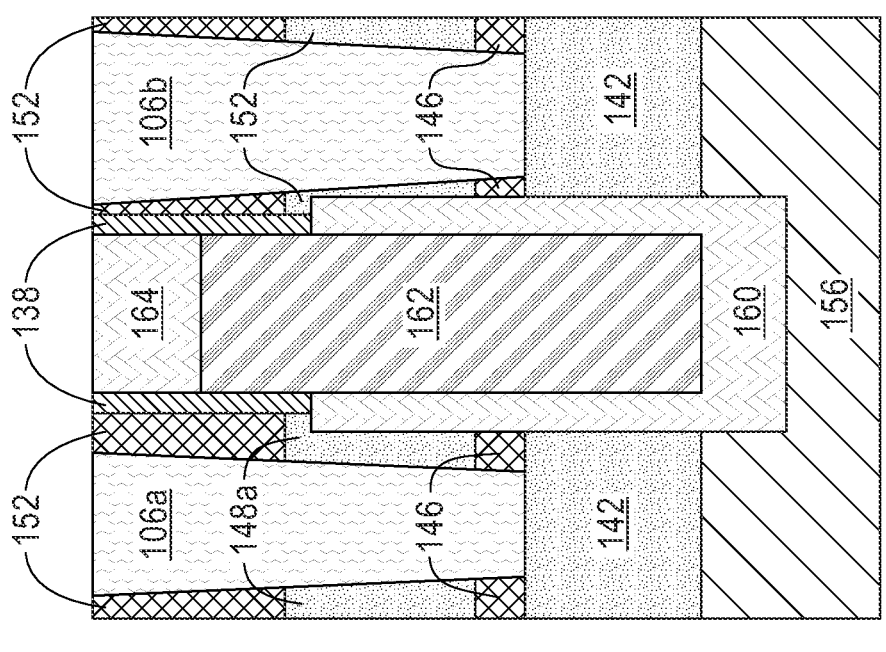
Figure 9B:
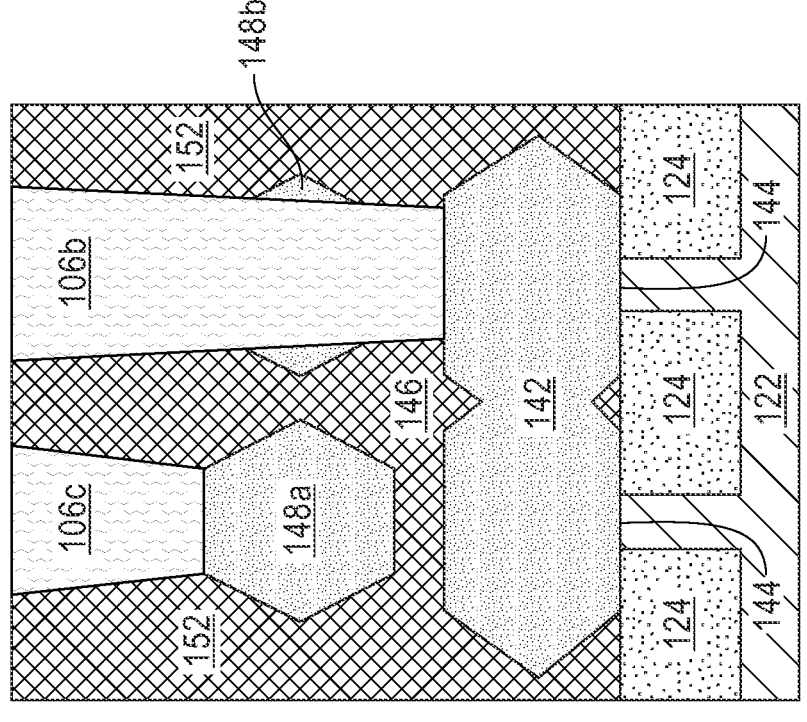

FIGS. 9A, 9B, and 9C are schematic cross-sectional side views of the semiconductor structure 100 of FIG. 1 at a subsequent fabrication stage, in accordance with one embodiment of the present invention. The semiconductor structure 100 shows the contacts 106a, b, c metallized to connect to the lower S/D 142 and the upper S/Ds 148*a, b*. The contacts 106*a, b, c* may be formed by first etching a contact hole and then filling the contact hole with a metal or other conductive material. In particular, the contacts 106*a, b, c* may be formed of a metal such as tungsten, cobalt, ruthenium, tantalum, copper, or alloys comprising carbon. Additionally, in certain embodiments, a silcide liner (such as Ni, Ti, NiPt) and a thin metal adhesion liner (such as TiN) can be formed prior to the conductive metal depositionAfter deposition of the contacts 106*a, b, c* a chemical-mechanical planarization (CMP) process may be used to polish the semiconductor structure 100.

In operation, the semiconductor structure 100 sends or receives signals using the contacts 106*a, b, c*. The contacts 106*a, b, c* then convey the signals to the S/Ds 142, 148, or receive signals from the S/Ds 142, 148 depending on the signal carried by the gate stack 162. The third contact 106*c* contacts the first upper S/D 148*a*, which operates normally by contacting the upper FET 128*a*. The upper FET 128*a* passes or blocks the signal according to a charge on the gate stack 162. The result of the signal is conveyed to the fourth contact 106*d* (see FIG. 1). The second contact 106*b* passes through the now-defunct second upper S/D 148*b* and contacts the double-wide lower S/D 142, which also operates normally by contacting the lower FET 126*a*.

Therefore, in a finFET embodiment of a semiconductor structure 100 growing a laterally-extended double-wide lower S/D 142 across the lower FET 126*a* of an active channel stack and the lower FET 126*b* over the dummy stub 156 of a dummy stack thus enables a signal to be conveyed the from the vertically-oriented contact 106 to the active lower FET 126*a*.

Figure 10:
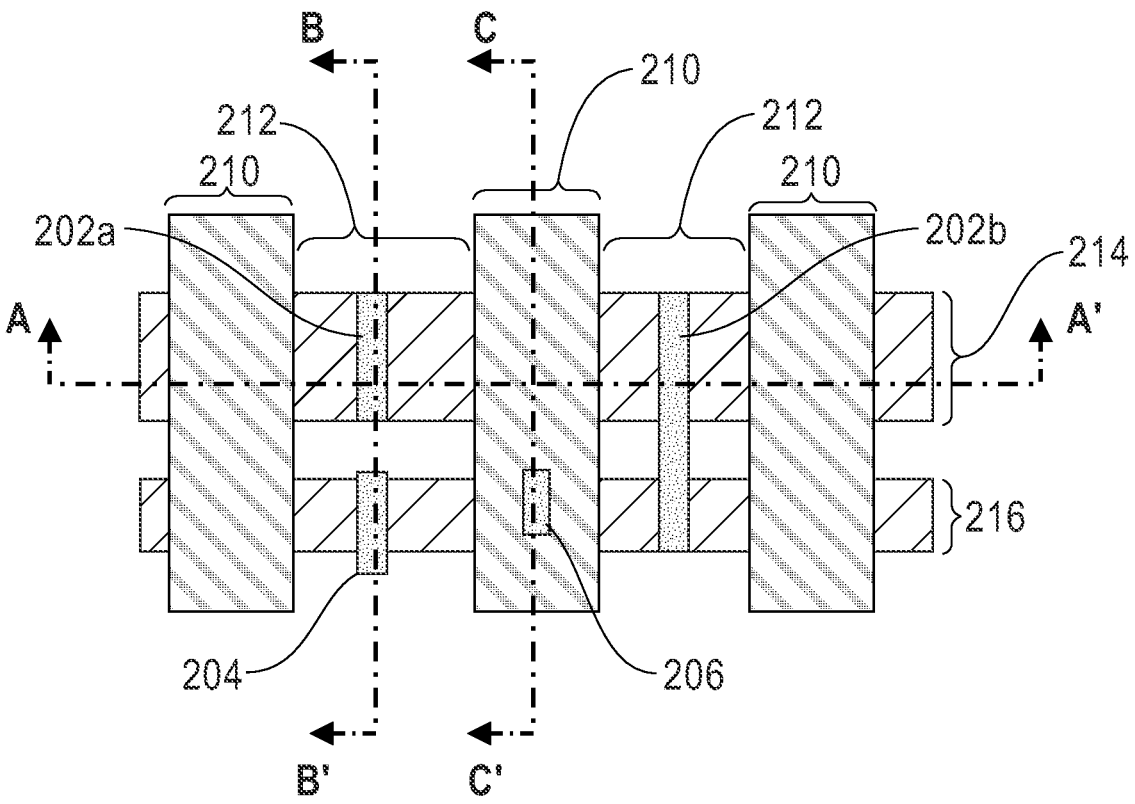
FIG. 10 depicts a schematic top view of a semiconductor structure, in accordance with one embodiment of the present invention.

FIG. 10 depicts a schematic top view of a semiconductor structure 200, in accordance with a second embodiment of the present invention. The schematic view shows a relationship of rows and columns at a fabrication stage after middle-of-line (MOL) contacts have been metallized. The MOL contacts include a first upper FET contact 202*a*, a shared contact 202*b*, a lower FET contact 204, and a gate contact 206. The columns include alternating gate regions 210 and S/D regions 212, which can be seen in the "A" Figures below. That is, FIGS. 11A, 12A, 13A, 14A, 15A, 16A, 17A, and 18A are taken along line A-A' in FIG. 10, and show a cross-sectional side view illustrating two S/D regions 212 and three gate regions 210. The row through which line A-A' passes is an active channel stack 214 of the semiconductor structure 200. FIG. 10 also illustrates a dummy stack 216. The dummy stack 216, as illustrated, may include a narrower lateral distance (up-down direction in FIG. 10) than the active channel stack 214. This narrower lateral distance is still sufficient for contact formation, but provides additional device area to be devoted to the active channel stack 214. FIGS. 11B, 12B, 13B, 14B, 15B, 16B, 17B, and 18B are taken along line B-B' in FIG. 10, and show a cross-sectional side view illustrating the active channel stack 214 and the dummy stack 216 within one of the S/D regions 212 at fabrication stages of the semiconductor structure 200. FIGS. 11C, 12C, 13C, 14C, 15C, 16C, 17C, and 18C are taken along line C-C' in FIG. 10, and show a cross-sectional side view illustrating the active channel stack 214 and the dummy stack 216 within one of the gate regions 210 at fabrication stages of the semiconductor structure 200.

Figure 11A:
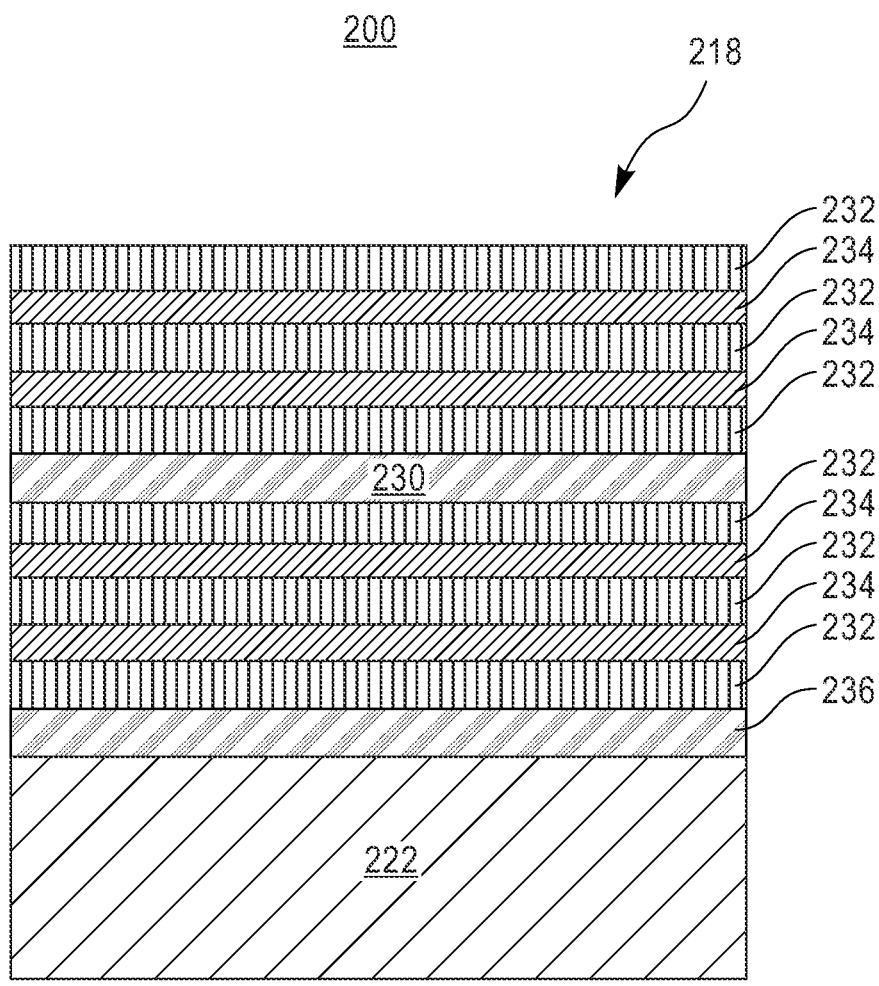
FIGS. 11A, 11B, and 11C depict schematic cross-sectional side views of the semiconductor structure of FIG. 10 at a fabrication stage, in accordance with one embodiment of the present invention.
Figure 11C:
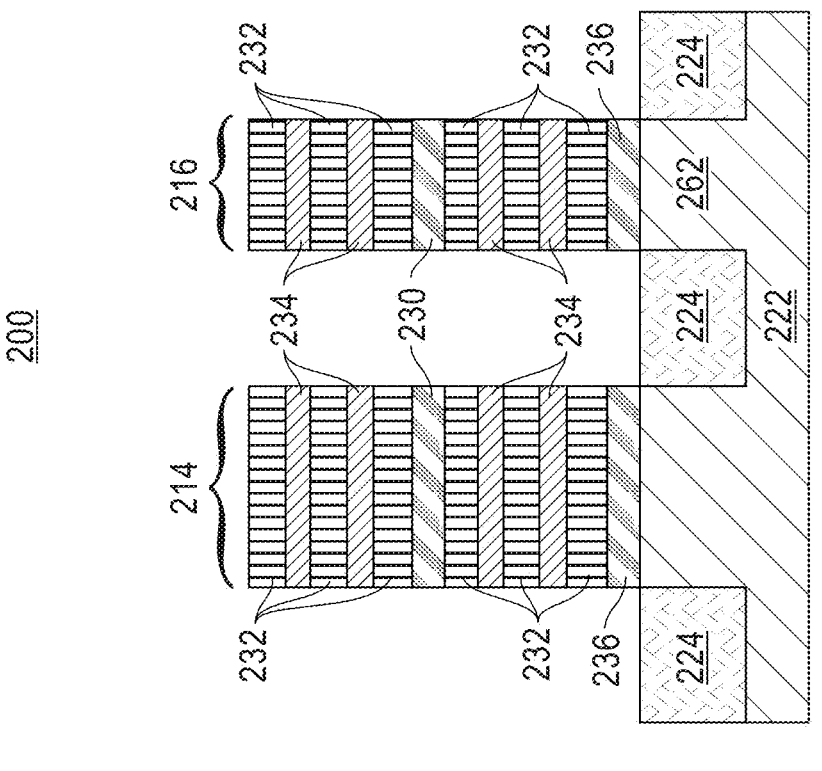
Figure 11B:
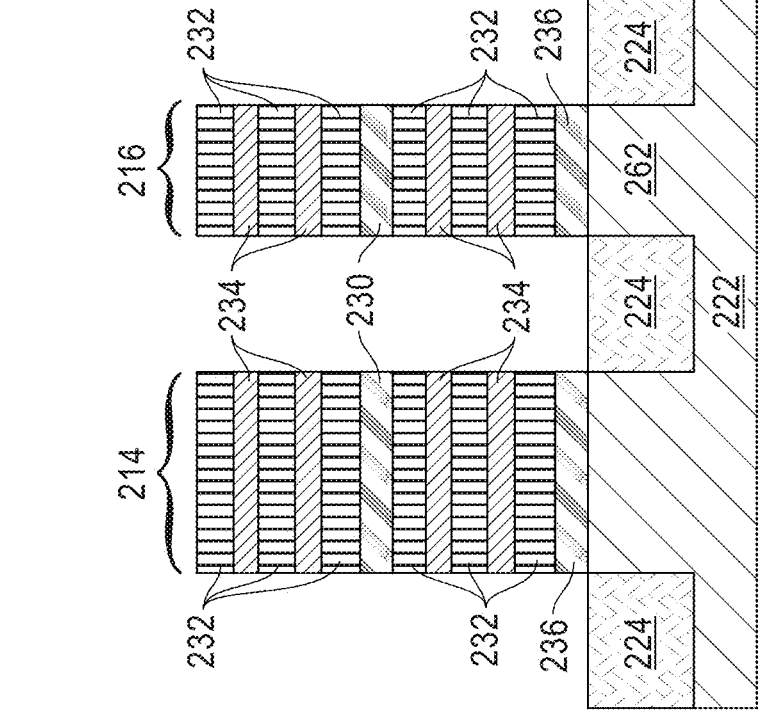

FIGS. 11A, 11B, and 11C are schematic cross-sectional side views of the semiconductor structure 100 of FIG. 10 at a fabrication stage, in accordance with one embodiment of the present invention. Looking first at FIG. 11A, the semiconductor structure 200 has nanosheets 218 that extend laterally along the active row of the semiconductor structure 200 through the gate regions 210 and the S/D regions 212. A substrate 222 also extends along the length of the semiconductor structure 200 through the gate regions 210 and the S/D regions 212. The nanosheets 218 (i.e., nanosheets or nanowires) may be composed of a semiconductor material, such as silicon (Si). The nanosheets 218 may be formed by a known epitaxial growth process. The number of nanosheets 218 may differ (more layers or fewer layers) from the number depicted in the representative embodiment. The nanosheets 218 are divided into a lower nanosheet FET 226 and an upper nanosheet FET 228 by a divider 230. Each nanosheet FET 226 includes a first sacrificial layer 232 and nanosheet channel layer 234. The middle divider 230 and bottom divider 236 are second sacrificial layers which are different than first sacrificial layers 232. A bottom divider 236 may divide the lower nanosheet FET 226 from the substrate 222. In some embodiment, the first sacrificial layer 232 can be SiGe with Germanium percentage ranging from 20 percent to 40 percent. The nanosheet channel later 234 can be Si. The middle divider 230 and bottom divider 236 can be SiGe with Germanium percentage ranging from 50 percent to 70 percent.

The nanosheets 218 in the active channel stack 214 may be formed at the same time and in the same manner as the nanosheets 218 of the dummy stack 216. For example, the nanosheets 218 may be formed as blanket layers using epitaxial growth and then subsequently patterned (e.g., by conventional lithography and reactive ion etch (RIE)) into the individual active channel stack 214 and dummy stack 216 illustrated in FIGS. 11B and 11C. FIGS. 11B and 11C also show that the active channel stack 214 and dummy stack 216 are flanked by shallow trench isolation (STI) 224. The active channel stack 214 may (as illustrated) include a lateral width that is greater than a lateral width of the dummy stack 216. In certain embodiments, the lateral widths of the active channel stack 214 and the dummy stack 216 may be the same.

Figure 12A:
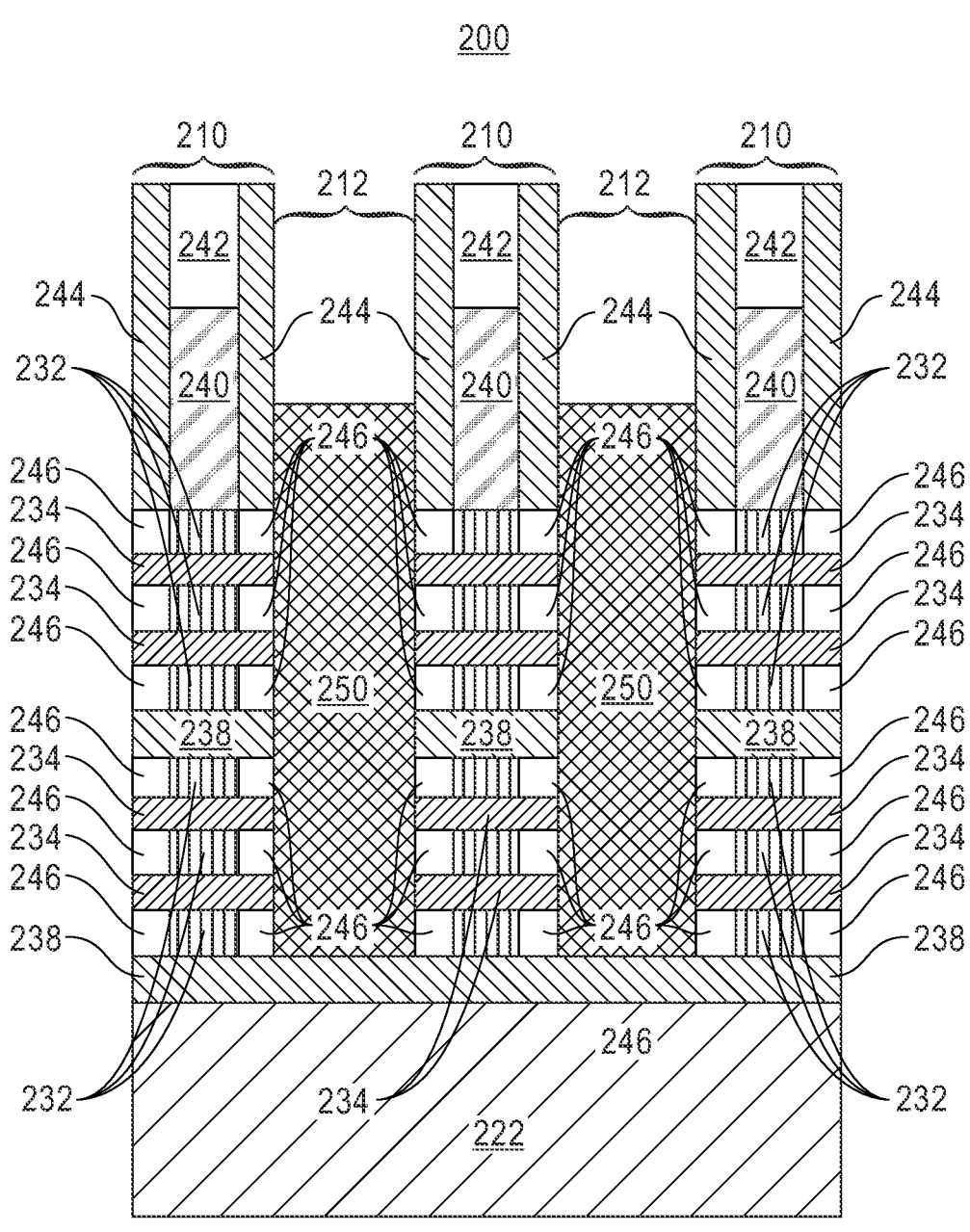
FIGS. 12A, 12B, and 12C depict schematic cross-sectional side views of the semiconductor structure of FIG. 10 at a fabrication stage, in accordance with one embodiment of the present invention.
Figures 12B, 12C:
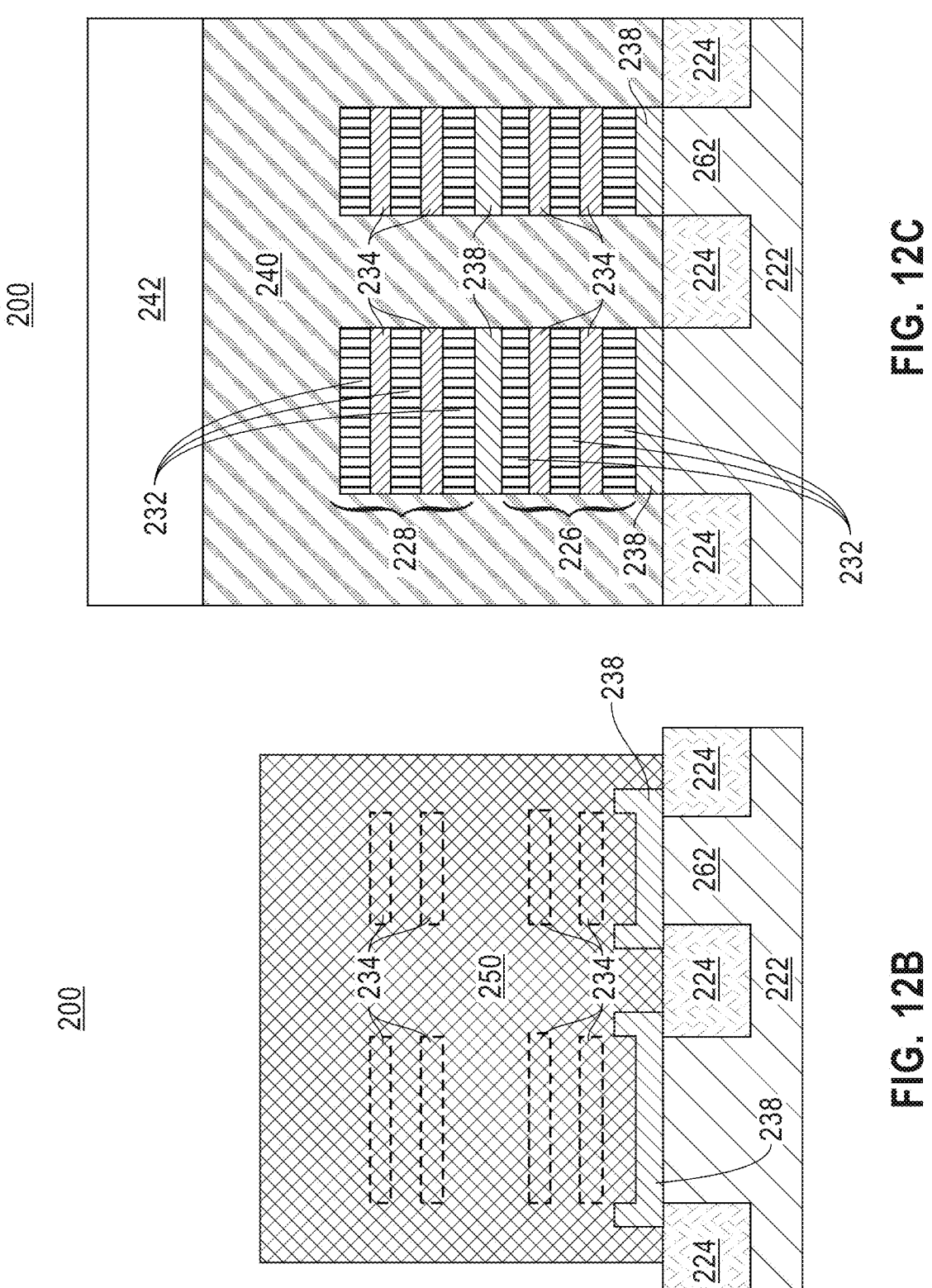

FIGS. 12A, 12B, and 12C are schematic cross-sectional side views of the semiconductor structure 100 of FIG. 10 at a subsequent fabrication stage, in accordance with one embodiment of the present invention. The semiconductor structure 200 includes dielectric isolation structures 238 at the bottom of the lower nanosheet FET 226 and the upper nanosheet FET 228. The dielectric isolation structures 238 replace the divider 230 and the bottom divider 236 to isolate the nanosheet FETs 226, 228 from the substrate 222 and from each other.

Using conventional lithography and etch processes, dummy gate 240 (with gate hardmask 242) are formed. After that, middle divider 230 and bottom divider 236 are selectively removed such that cavities are formed between top and bottom nanosheet stacks and between bottom nanosheet stack and substrate. After that, spacer dielectric is deposited followed by anisotropic spacer RIE to form the gate spacer 244. The conformal spacer liner also fills the cavities and forms middle and bottom isolation 238. After that, the nanosheet stacks that are not protected by dummy gate or spacers are recessed, first sacrificial layers 232 are recessed, inner spacer 246 is formed in the recess followed by lower S/D epi growth 250. The dummy gates 240 can include dummy gate material, such as a thin layer of SiO2, and amorphous silicon or polycrystalline silicon (poly silicon). The gate hard mask 242 can be a dielectric material such as SiO2, SiN or combination of both. The spacers 244 and inner spacers 246 can be a nitride based material such as silicon boron carbide nitride (SiBCN), SiOCN, SiN, SiOC, etc.

The lower S/D epitaxial regions 250 can be NFET S/D epitaxial regions or PFET S/D epitaxial regions according to formation of the NFET or PFET devices. Accordingly, the lower S/D epitaxial regions 250 can be doped with N-type dopants or P-type dopants as desired. The lower S/D epitaxial regions 250 can be epitaxially grown from the edges of the silicon layers 234. A first growth grows on the silicon layers 234 of the active channel stack 214 of the lower nanosheet FET 226 and the upper nanosheet FET 228, while a second growth grows on the silicon layers 234 of the dummy stack 216 of the lower nanosheet FET 226 and the upper nanosheet FET 228. The growths of the lower S/D epitaxial regions 250 merge together to fill the space between the gate regions 210, covering both the active channel stack 214 and the dummy stack 216. That is, the epitaxial growth on the silicon layers 234 of the active channel stack 214 grows together with the epitaxial growth on the silicon layers 234 of the dummy stack 216 until the lower S/D epitaxial regions 250 form a single double-wide S/D structure.

Figure 13A:
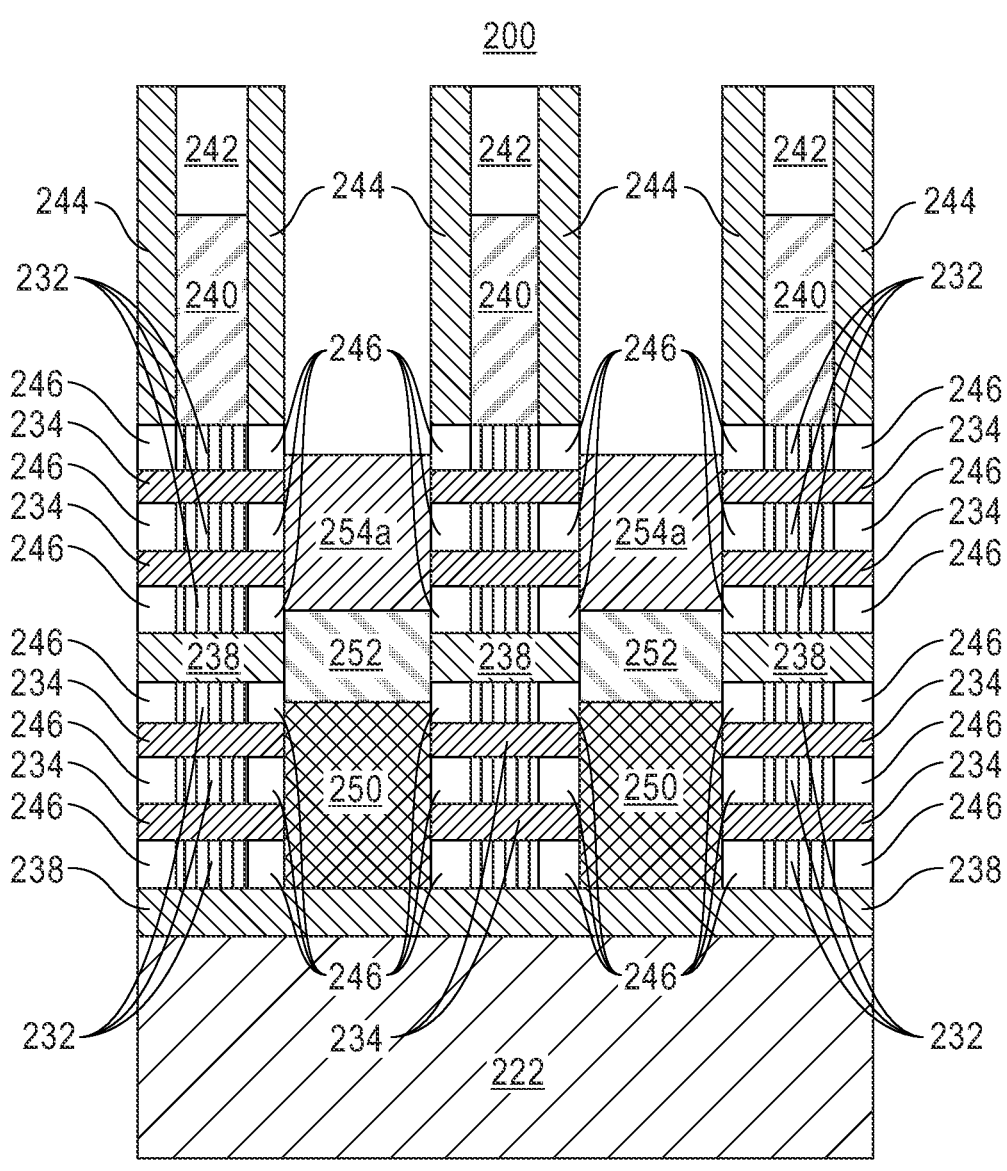
FIGS. 13A, 13B, and 13C depict schematic cross-sectional side views of the semiconductor structure of FIG. 10 at a fabrication stage, in accordance with one embodiment of the present invention.
Figures 13B, 13C:
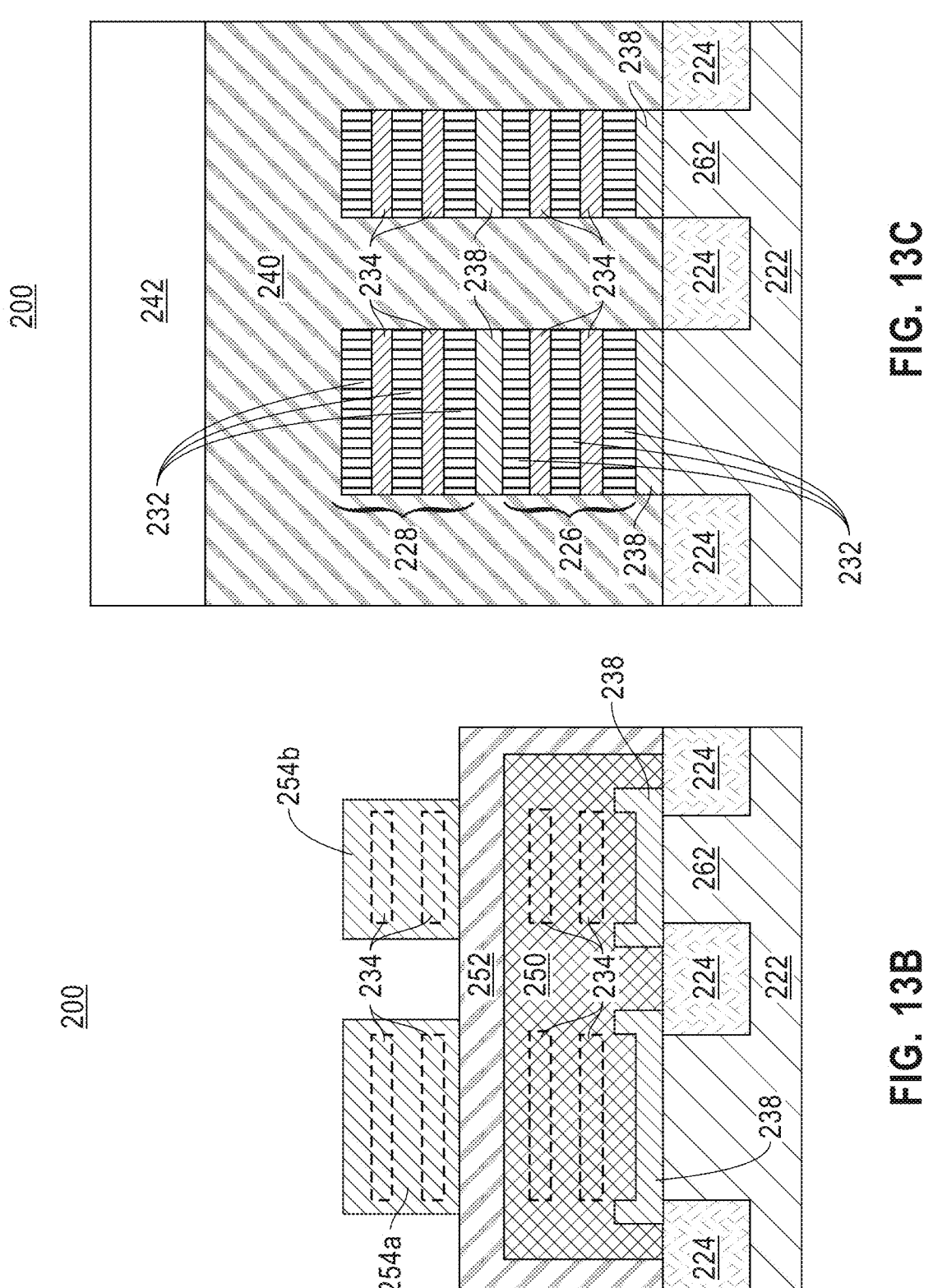

FIGS. 13A, 13B, and 13C are schematic cross-sectional side views of the semiconductor structure 100 of FIG. 10 at a subsequent fabrication stage, in accordance with one embodiment of the present invention. The semiconductor structure 200 has the lower S/D epitaxial regions 250 recessed using an etch selective process (e.g., dry chemical etch, wet chemical etch) that does not affect the spacers 244, inner spacers 246, or the silicon layers 234. The lower S/D epitaxial regions 250 are recessed below the first dielectric isolation structure 238 so that the lower S/D epitaxial regions 250 are connected only to the lower nanosheet FET 226. Following the recession of the lower S/D epitaxial regions 250, the semiconductor structure 200 includes a bottom dielectric 252 that is formed over the lower S/D epitaxial regions 250.

The semiconductor structure 200 then includes a second round of epitaxial growth. Epitaxial growth on the silicon layers 234 of the upper nanosheet FET 228 forms upper S/D epitaxial regions 254_a_, _b_ that are separated from the lower S/D epitaxial regions 250 by the bottom dielectric 252. The upper S/D epitaxial regions 254_a_, _b_ are grown so that a first upper S/D epitaxial region 254_a_ stays separate from a second upper S/D epitaxial region 254_b_ within each S/D region 212.

Figure 14A:
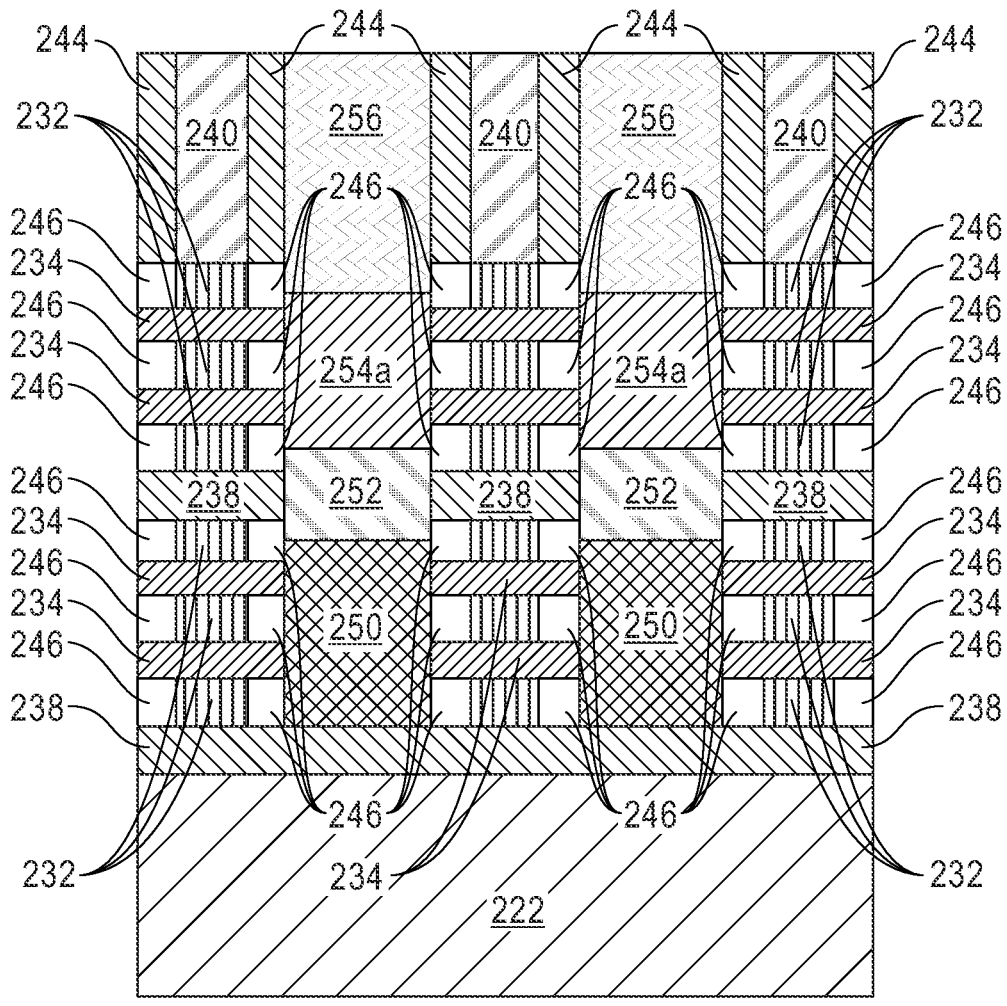
FIGS. 14A, 14B, and 14C depict schematic cross-sectional side views of the semiconductor structure of FIG. 10 at a fabrication stage, in accordance with one embodiment of the present invention.
Figures 14B, 14C:
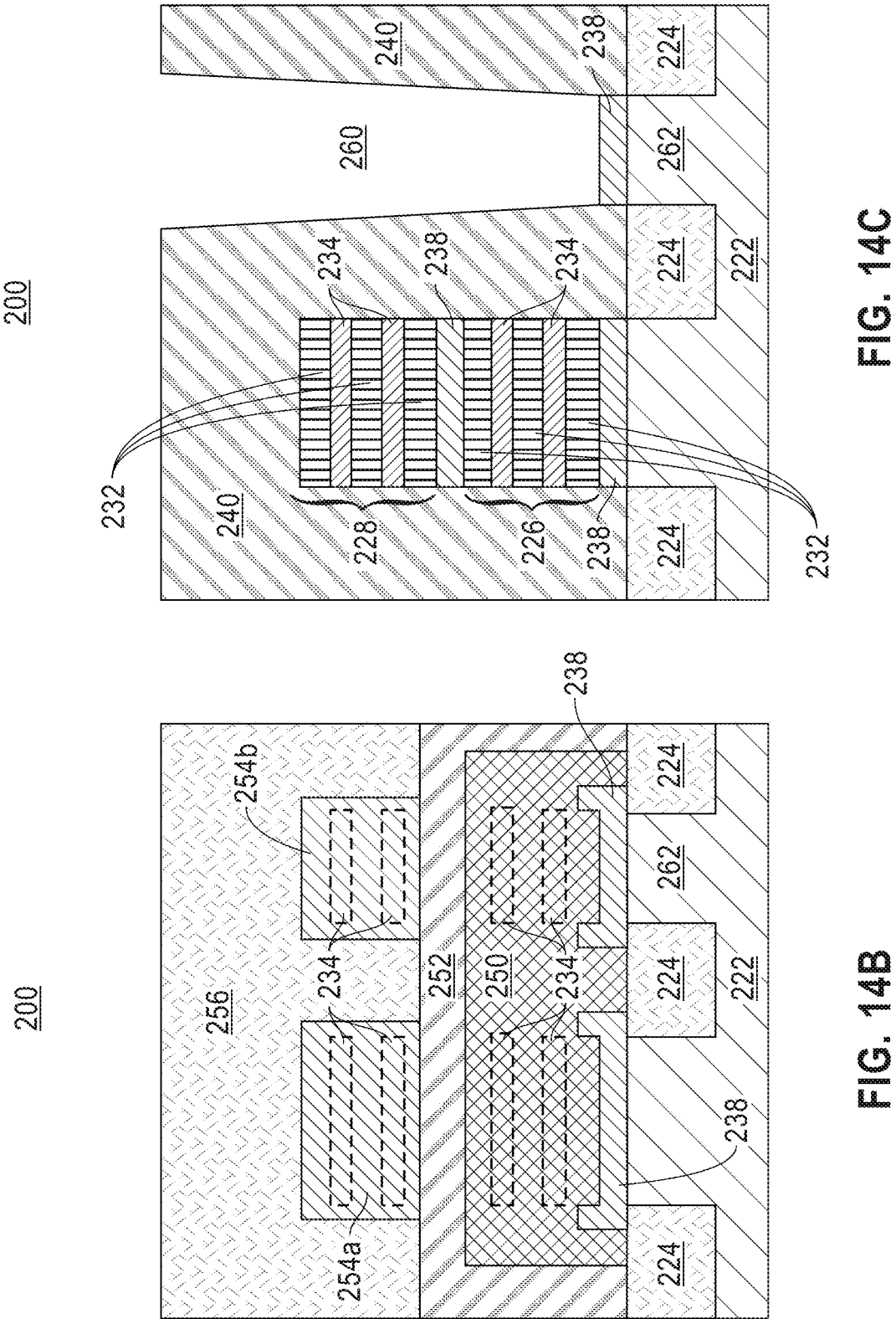

FIGS. 14A, 14B, and 14C are schematic cross-sectional side views of the semiconductor structure 100 of FIG. 10 at a subsequent fabrication stage, in accordance with one embodiment of the present invention. The semiconductor structure 200 includes an interlayer dielectric (ILD) 256 formed over the upper S/D epitaxial regions 254_a_, _b_, and a removal opening 260 etched through the dummy stack 216. The ILD 256 maintains the isolation of the first upper S/D epitaxial region 254_a_ and the second upper S/D epitaxial region 254_b_ for all subsequent processes in the fabrication of the semiconductor structure 200. After the ILD 256 forms on the semiconductor structure 200, CMP may be performed so that the ILD 256, the dummy gate 240, and the spacers 244 are flush. The removal opening 260 etches through and removes the upper nanosheet FET 228 and the lower nanosheet FET 226 from the dummy stack 216, so that only a dummy stub 262 remains below the removal opening 260. The dummy stack 216 may be removed using lithographic masks that are not illustrated in this embodiment.

Figure 15A:
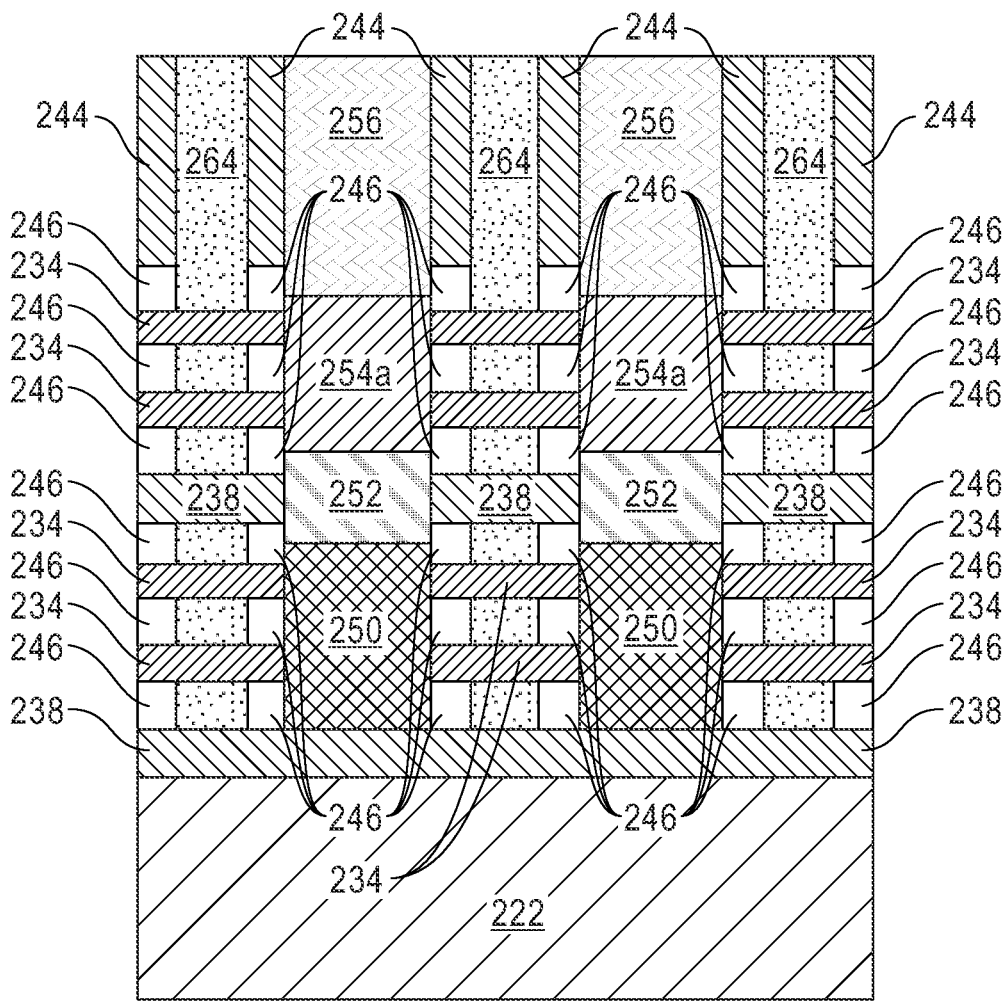
FIGS. 15A, 15B, and 15C depict schematic cross-sectional side views of the semiconductor structure of FIG. 10 at a fabrication stage, in accordance with one embodiment of the present invention.
Figure 15C:
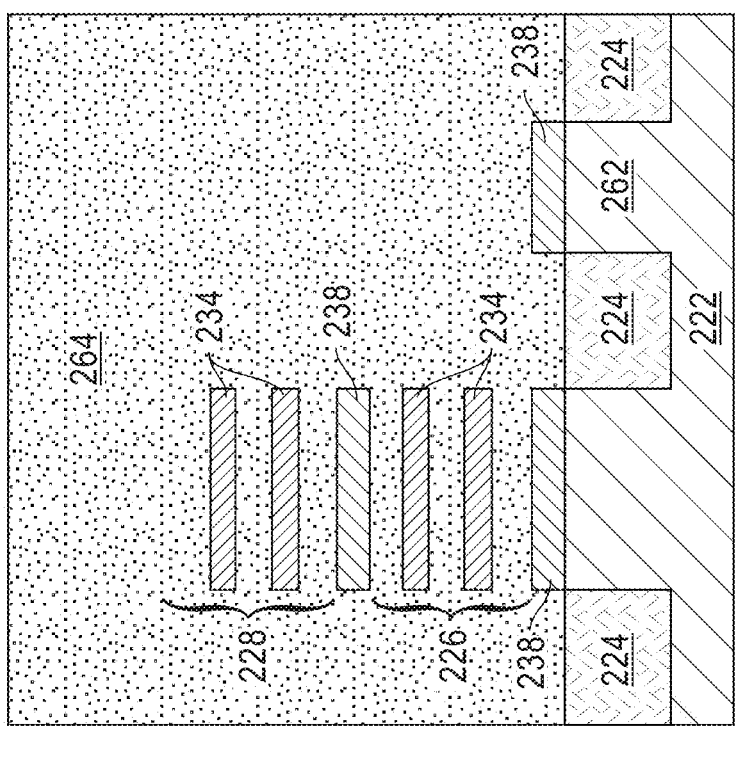
Figure 15B:
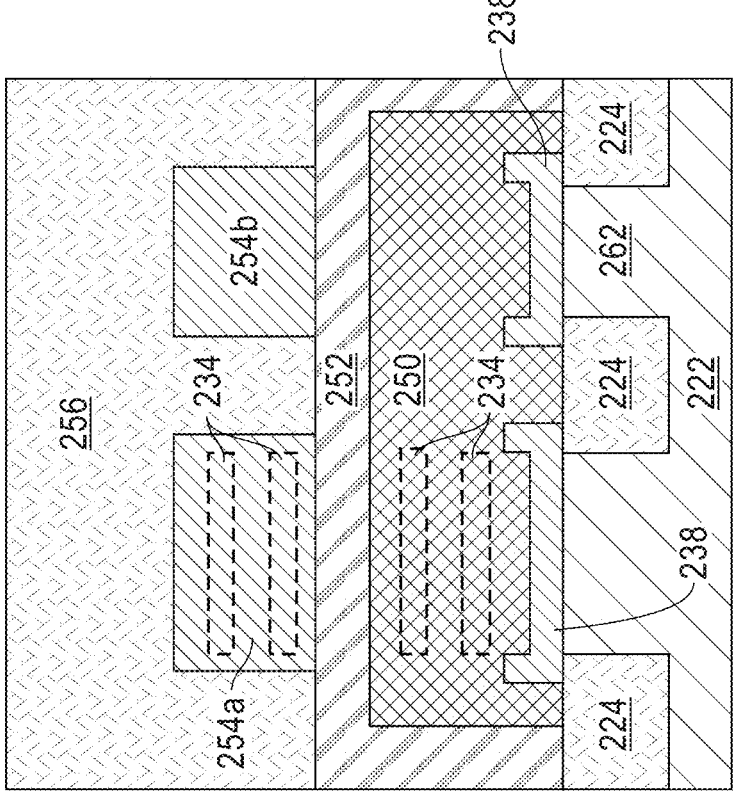

FIGS. 15A, 15B, and 15C are schematic cross-sectional side views of the semiconductor structure 100 of FIG. 10 at a subsequent fabrication stage, in accordance with one embodiment of the present invention. The semiconductor structure 200 includes a replacement metal gate 264 that replaces the dummy gate 240 and first sacrificial layers and enables control of the lower nanosheet FET 226 and the upper nanosheet FET 228. The dummy gate 240 is removed using etch selective processes that do not affect the spacers 244 or inner spacers 246. The first sacrificial layers 232 of the semiconductor structure 200 are also released so that the replacement metal gate 264 may form around each of the silicon layers 234 of each nanosheet FET 226, 228. The replacement metal gate 264 forms above the dummy stub 262, but does not have silicon layers 234. Instead, the replacement metal gate 264 forms a wider block of gate material that increases area available for a gate contact to attach to the replacement metal gate 264.

Figure 16A:
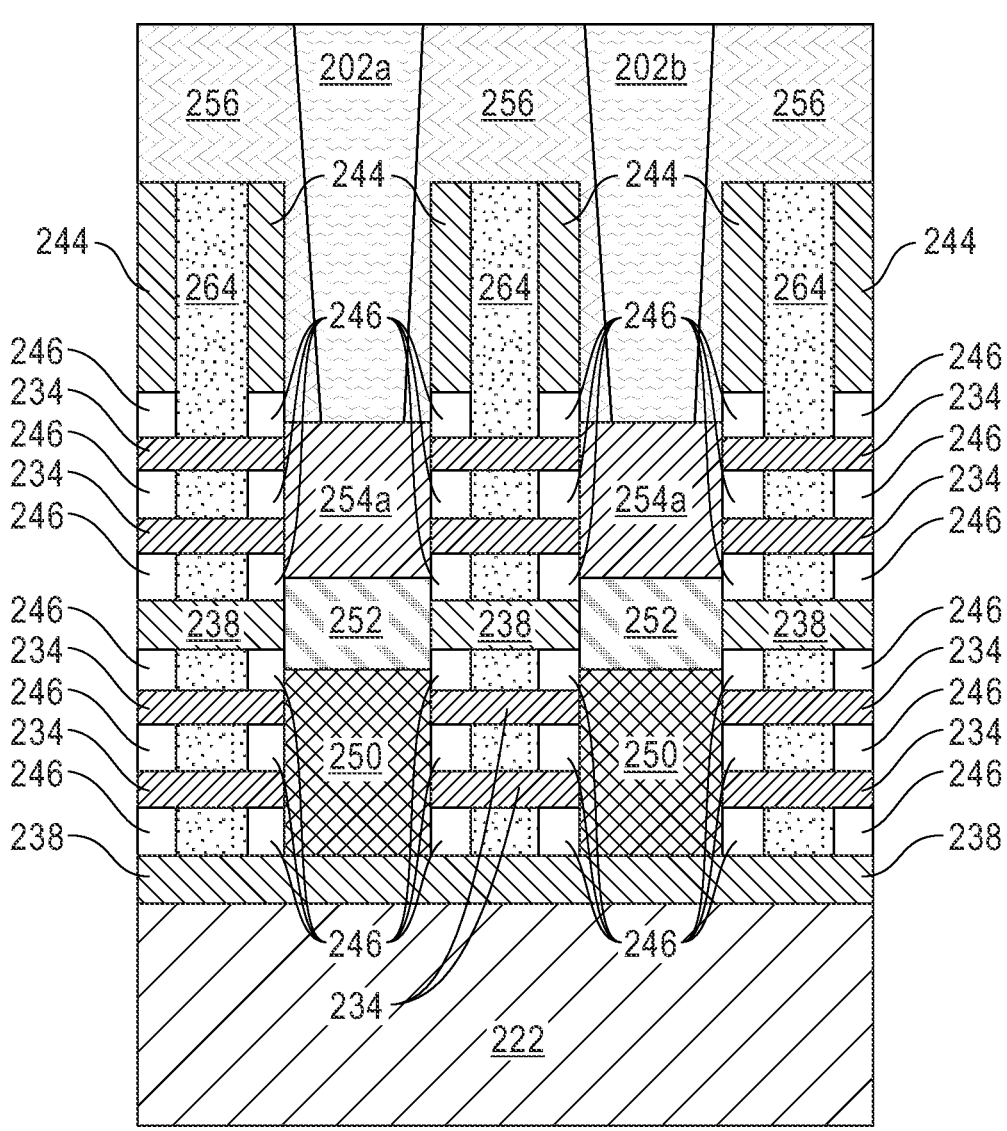
FIGS. 16A, 16B, and 16C depict schematic cross-sectional side views of the semiconductor structure of FIG. 10 at a fabrication stage, in accordance with one embodiment of the present invention.
Figures 16B, 16C:
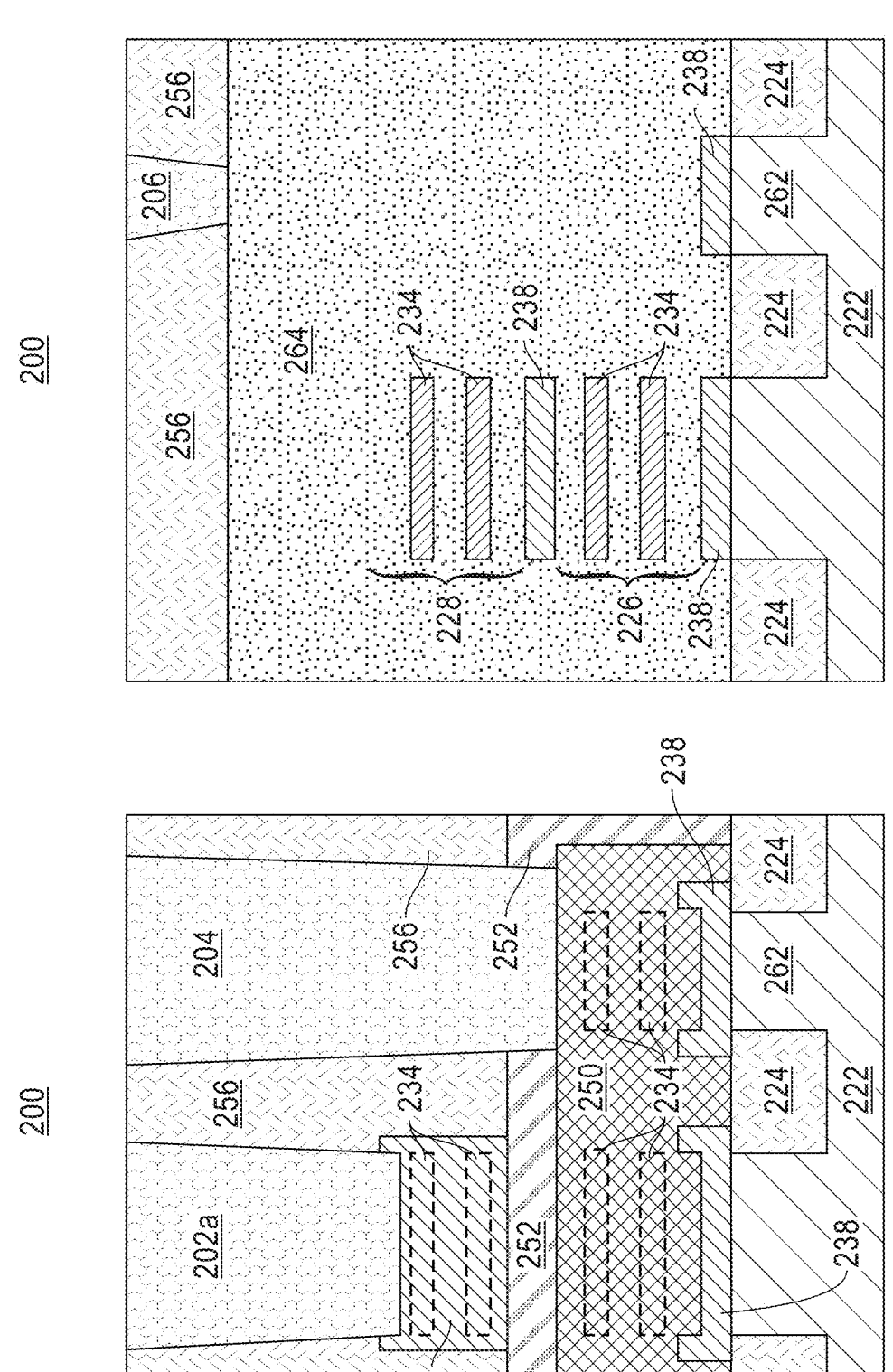

FIGS. 16A, 16B, and 16C are schematic cross-sectional side views of the semiconductor structure 100 of FIG. 10 at a subsequent fabrication stage, in accordance with one embodiment of the present invention. The semiconductor structure 200 includes the upper FET contacts 202_a_, the lower FET contact 204, and the gate contact 206 first illustrated in FIG. 10. The upper FET contacts 202_a_ contact the upper S/D epitaxial regions 254_a_ while the lower FET contact 204 contacts the double-wide lower S/D epitaxial region 250. The lower FET contact 204 is formed through the second upper S/D epitaxial region 254 to the lower S/D epitaxial region 250. The lower S/D epitaxial region 250 is thus able to read/write signals from the lower nanosheet FET 226 without interference with the upper nanosheet FET 228.

The integrated circuit chips resulting from the processes described herein can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
an active channel stack comprising an upper field-effect transistor (FET) and a lower FET vertically stacked below the upper FET;
a dummy stub adjacent to the active channel stack and protruding between shallow trench isolations (STIs) in a gate region;
a lower source/drain (S/D) connected to the active channel stack and laterally extended over the dummy stub; and
an upper S/D connected to the active channel stack above the lower S/D.

2. The semiconductor structure of claim 1, further comprising:
a lower S/D contact located above the dummy stub; and
an upper S/D contact located above the active channel stack.

3. The semiconductor structure of claim 1, wherein the active channel stack comprises a fin FET.

4. The semiconductor structure of claim 3, further comprising a dielectric liner above the dummy stub, wherein the dielectric liner surrounds a high-κ metal gate and a work-function metal (WFM).

5. The semiconductor structure of claim 4, wherein the dielectric liner isolates the high-κ metal gate and the WFM from the lower S/D and the upper S/D.

6. The semiconductor structure of claim 1, wherein the upper FET is a nanosheet FET.

7. The semiconductor structure of claim 6, further comprising a dielectric isolation structure between the upper FET and the lower FET.

8. The semiconductor structure of claim 6, wherein the active channel stack comprises a lateral width that is greater than a lateral width of the the dummy stub.

9. A method, comprising:
forming an active channel stack and a dummy stack adjacent to the active channel stack;
growing a lower source/drain (S/D) across the active channel stack and the dummy stack;
growing a first top S/D on the active channel stack and a second top S/D on the dummy stack; and
removing the dummy stack except for a dummy stub that protrudes between the shallow trench isolations (STIs).

10. The method of claim 9, wherein forming the active channel stack comprises forming a fin field-effect transistor (fin FET).

11. The method of claim 10, wherein the dummy stack comprises a fin structure adjacent to the fin FET.

12. The method of claim 10, wherein removing the dummy stack comprises forming a gap within a shallow trench isolation (STI) structure over the dummy stub.

13. The method of claim 12, further comprising forming a dielectric liner in the gap, wherein the dielectric liner surrounds a high-κ metal gate and a work-function metal (WFM).

14. The method of claim 9, further comprising forming a lower contact through the second top S/D to the lower S/D.

15. The method of claim 9, wherein forming the active channel stack comprises forming a nanosheet field-effect transistor (FET).

16. The method of claim 15, wherein the active channel stack comprises a lateral width that is greater than a lateral width of the dummy stack.

17. A semiconductor structure, comprising:
an upper source/drain (S/D) electrically connected to an active channel stack;
a lower S/D electrically connected to the active channel stack, wherein the lower S/D comprises:
a first growth between the upper S/D and the active channel stack; and
a second growth between a dummy stub and a contact, wherein the dummy stub protrudes up from the substrate between shallow trench isolations (STIs) in a gate region.

18. The semiconductor structure of claim 17, further comprising:
a lower S/D contact located above the dummy stub; and
an upper S/D contact located above the active channel stack.

19. The semiconductor structure of claim 17, wherein the active channel stack comprises a fin field-effect transistor (fin FET).

20. The semiconductor structure of claim 17, wherein the active channel stack comprises a nanosheet field-effect transistor (FET).

* * * * *